(12) United States Patent
Iyer et al.

(10) Patent No.: US 10,936,772 B1
(45) Date of Patent: Mar. 2, 2021

(54) METHODS FOR INCREMENTAL CIRCUIT PHYSICAL SYNTHESIS

(71) Applicant: Altera Corporation, San Jose, CA (US)

(72) Inventors: Mahesh A. Iyer, Fremont, CA (US); Robert Walker, Boulder, CO (US); Vasudeva M. Kamath, San Jose, CA (US)

(73) Assignee: Altera Corporation, San Jose, CA (US)

( * ) Notice: Subject to any disclaimer, the term of this patent is extended or adjusted under 35 U.S.C. 154(b) by 747 days.

(21) Appl. No.: 15/233,855

(22) Filed: Aug. 10, 2016

(51) Int. Cl.
*G06F 30/327* (2020.01)
*G06F 30/3312* (2020.01)

(52) U.S. Cl.
CPC ........ *G06F 30/327* (2020.01); *G06F 30/3312* (2020.01)

(58) Field of Classification Search
CPC .................................................... G06F 30/327
USPC ......................................................... 716/116
See application file for complete search history.

(56) References Cited

U.S. PATENT DOCUMENTS

| | | |
|---|---|---|
| 7,814,452 B1 | 10/2010 | Jang et al. |
| 7,886,256 B1 | 2/2011 | Jha et al. |
| 7,996,797 B1* | 8/2011 | Singh ............... G06F 30/327 716/103 |
| 8,510,688 B1 | 8/2013 | Singh et al. |
| 8,856,702 B1 | 10/2014 | Singh et al. |
| 2010/0257499 A1* | 10/2010 | Alpert ............... G06F 30/39 716/132 |
| 2013/0339913 A1 | 12/2013 | Stavinov |

OTHER PUBLICATIONS

Iyer et al., U.S. Appl. No. 15/154,785, filed May 13, 2016.

\* cited by examiner

*Primary Examiner* — Eric D Lee
(74) *Attorney, Agent, or Firm* — Fletcher Yoder P.C.

(57) ABSTRACT

Configuration data for an integrated circuit may be generated using logic design equipment to implement a logic design on the integrated circuit. The equipment may perform multiple rounds of incremental physical synthesis, incremental timing analysis, and incremental legalization operations. Each round may involve performing multiple different physical synthesis transforms on the design that are individually rejected until transforms that satisfy legality constraints and improve timing for the logic design are found and incorporated into the netlist. The configuration data may then be generated using the netlist. In this way, the logic design may be incrementally altered and verified during the physical synthesis process. This prevents the need for rejecting or accepting an entire batch logic changes to the netlist even when only some of the changes are non-ideal, thus optimizing circuit performance as well as the compile time required to implement the logic design on the integrated circuit.

20 Claims, 11 Drawing Sheets

METHODS FOR INCREMENTAL CIRCUIT PHYSICAL SYNTHESIS

BACKGROUND

This relates to integrated circuits and more particularly, to systems for designing logic circuitry on integrated circuit devices such as programmable integrated circuits.

Programmable integrated circuits are a type of integrated circuit that can be programmed by a user to implement a desired custom logic function. In a typical scenario, a logic designer uses computer-aided design tools to design a custom logic circuit that performs custom logic functions. When the design process is complete, the computer-aided design tools generate configuration data. The configuration data is loaded into memory elements to configure the devices to perform the functions of the custom logic circuit. Memory elements are often formed using random-access-memory (RAM) cells. Because the RAM cells are loaded with configuration data during device programming, the RAM cells are sometimes referred to as configuration memory or configuration random-access-memory cells (CRAM).

Integrated circuits such as programmable integrated circuits often include millions of gates and megabits of embedded memory. The complexity of a large system requires the use of electronic design automation (EDA) tools to create and optimize a logic design for the system onto an integrated circuit (target device). The tools may perform logic synthesis operations to generate a gate-level description of the logic design for implementation on a target programmable logic device. Logic synthesis also performs technology mapping to map the gates onto logic elements (resources) that are available on the target programmable logic device. These include, but are not limited to, lookup-tables (LUTs), flip-flops, block RAMS, and digital signal processing (DSP) elements. The logic elements are then physically placed and routed onto the target programmable device, while concurrently optimizing for timing, area, wiring, routing congestion, and power.

Synthesized designs are also subject to design constraints sometimes referred to herein as legality rules. The legality rules identify acceptable ("legal") placements for logic elements in the design. The tools perform tests to determine whether the legality rules.

Conventionally, physical synthesis is performed either before or after the placement phase in a design implementation flow. The tools then perform clustering, placement, and timing analysis and to ensure that the legality rules are satisfied for the entire design after the post-placement physical synthesis. If the legality rules are not satisfied or if timing for the design has deteriorated after the physical synthesis, all changes made by the physical synthesis are scrapped even when only a small subset of the changes violate the legality rules or cause a deterioration in timing performance. Performing physical synthesis in this way can lead to excessive runtimes as well as fail to meet the timing constraints of the design.

SUMMARY

An integrated circuit may include memory elements arranged in rows and columns. The integrated circuit may be a programmable integrated circuit that can be programmed (e.g., using configuration data) by a user to implement desired custom logic functions (logic designs or systems). The configuration data may be generated using a logic design system (e.g., logic design equipment). When a target device such as a programmable integrated circuit is loaded with the configuration data, the target device may be programmed to implement the logic design identified by the configuration data.

The logic design equipment may perform multiple incremental physical synthesis, timing analysis, and legalization operations on the logic design prior to outputting the configuration data. The logic design equipment may generate a netlist based on a hardware description language (HDL) file generated by a logic designer. The netlist may identify the logic design and basic logic elements (BLEs) to be placed in the logic design.

The logic design equipment may place a set of BLEs at locations in the logic design. The equipment may perform a first set of physical synthesis transforms and a first set of timing analysis operations on the placed set of BLEs and/or other logic blocks in the logic design. After performing the first set of physical synthesis transforms and timing analysis operations, the equipment may pack or cluster the BLEs into adaptive logic modules (ALMs) and logic array blocks (LABs) in the logic design.

The equipment may subsequently perform a second set of physical synthesis transforms and timing analysis operations (and a first set of legalization operations that ensure that legalization constraints associated with the target device are satisfied) on the LABs and/or other logic blocks in the logic design.

After performing the second set of physical synthesis transforms and timing analysis operations, the equipment may move the LABs to modified (different) locations within the logic design. The equipment may perform a second set of legalization operations to ensure that the modified locations satisfy the legalization (legality) constraints, for example. After the LABs have been moved to the modified locations, the equipment may perform a third set of physical synthesis transforms and timing analysis operations (and a third set of legalization operations) on the moved LABs and/or other logic blocks in the logic design. If desired, the equipment may perform placement refinement operations on the LABs or other components in the logic design. After performing the placement refinement operations, the equipment may perform a fourth set of physical synthesis transforms and timing analysis operations (and a fourth set of legalization operations) on the logic design.

Each of the physical synthesis operations may involve modifying the netlist of the logic design. An assembler on the logic design equipment may assemble the configuration data based on the modified netlist. The logic design equipment may pass the configuration data to a configuration device that that configures the target device to implement the modified (optimized) logic design by loading the configuration data onto the target device.

In accordance with any of the above arrangements, in performing any of the first, second, third, and fourth sets of physical synthesis transforms and timing analysis operations, the equipment may identify a critical region in the logic design that includes a set of BLEs. The equipment may modify the netlist from an initial state by performing a first physical synthesis transform on the set of BLEs within the identified critical region. The equipment may incrementally determine whether performing the first physical synthesis transform on the set of BLEs within the identified critical region has satisfied a timing constraint associated with the logic design (e.g., whether the transform has improved a cost function or timing for the design). If desired, an incremental legalization operation may be performed on the design after performing the first physical synthesis transform and before incrementally determining whether the first physical synthesis transform has improved the timing of the design.

In response to determining that performing the first physical synthesis transform has not improved the timing of the design, the equipment may restore the netlist to the initial state and modify the netlist from the restored initial state by performing a second physical synthesis transform on the set of BLEs within the identified critical region. This process may be repeated until legal transforms (e.g., transforms that satisfy the legalization constraints) that improve the timing are found and incorporated into the netlist. In response to determining that performing the first physical synthesis transform has improved the timing of the design, the equipment may identify other critical regions or, in some scenarios, the assembler may proceed to assemble the configuration data based on the modified netlist file.

DETAILED DESCRIPTION

Embodiments of the present invention relate to integrated circuits and, more particularly, to ways for improving processing efficiency in generating logic designs that are implemented on the integrated circuits.

It will be obvious to one skilled in the art, that the present exemplary embodiments may be practiced without some or all of these specific details. In other instances, well-known operations have not been described in detail in order not to unnecessarily obscure the present embodiments.

Figure 1:
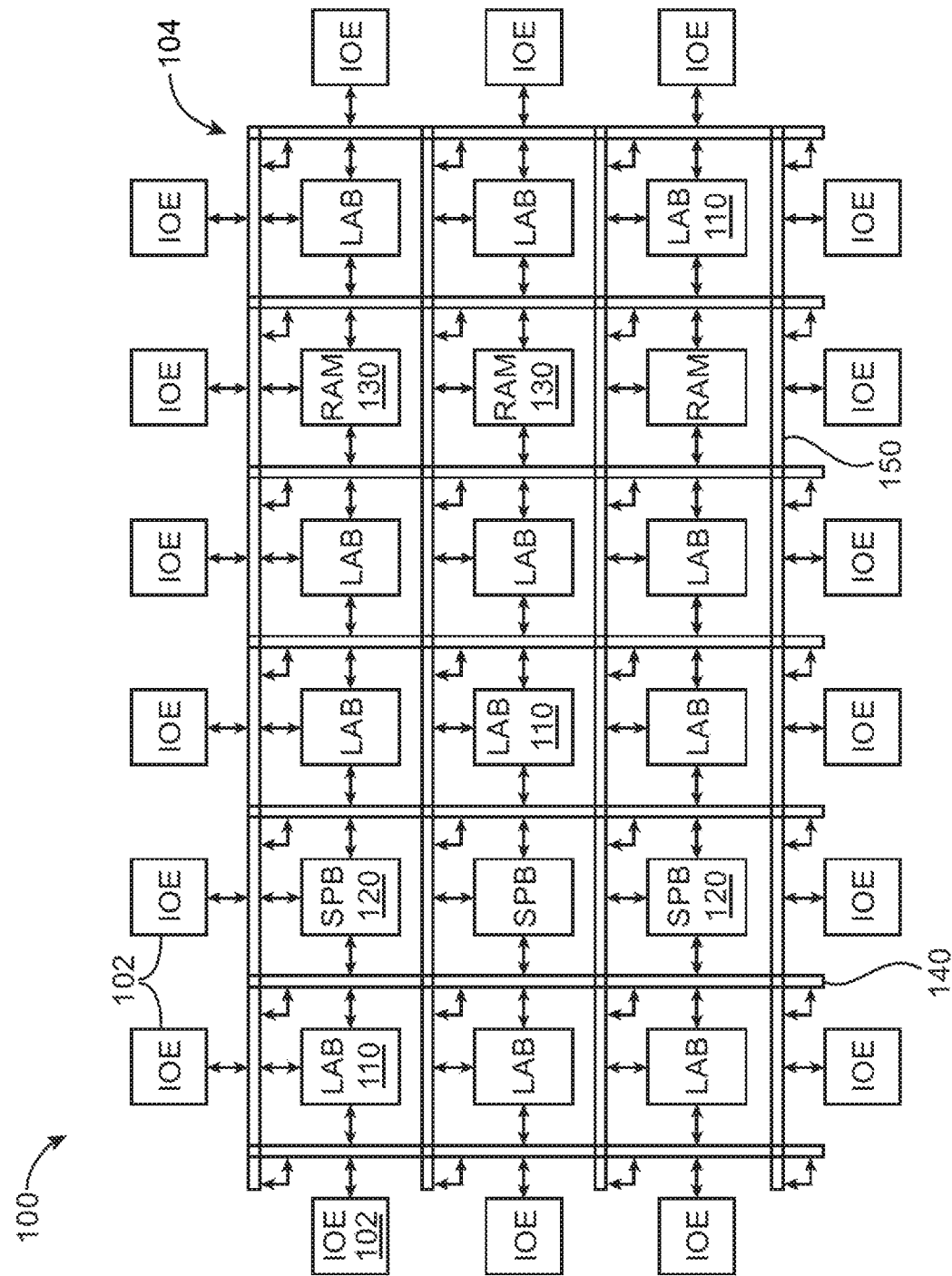
FIG. 1 is a diagram of an illustrative integrated circuit that includes core logic circuitry such as logic array blocks (LABs) and specialized processing blocks (SPBs) and that includes associated peripheral input-output elements (IOEs) in accordance with an embodiment.

FIG. 1 is a diagram of an integrated circuit 100 that can be used to implement logic designs. Integrated circuit 100 may be a memory chip, a digital signal processor (DSP), a microprocessor, an application specific integrated circuit (ASIC), or a programmable integrated circuit. Examples of programmable integrated circuits include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), or other suitable integrated circuits.

Integrated circuits such as programmable integrated circuits use programmable memory elements to store configuration data. During programming of a programmable integrated circuit, configuration data is loaded into the memory elements. During normal operation of the programmable integrated circuit, each memory element provides a static output signal. The static output signals that are supplied by the memory elements serve as control signals. These control signals are applied to programmable logic on the integrated circuit to customize the programmable logic to perform a desired logic function.

Memory elements may be organized in arrays having numerous rows and columns. For example, memory array circuitry may be formed in hundreds or thousands of rows and columns on a programmable logic device integrated circuit. Programmable integrated circuit 100 of FIG. 1 is an example of an illustrative integrated circuit on which memory array circuitry may be formed.

As shown in FIG. 1, integrated circuit 100 may include core logic circuitry 104 and input-output (IO)) circuitry such as IO circuitry 102 formed along each edge of integrated circuit 100 and surrounding logic circuitry 104. Input-output circuitry 102 may be used for driving signals off of device 100 and for receiving signals (e.g., power supply voltage signals, data signals, clock signals, address signals, commands, and other control signals, etc.) from other external devices.

In the example of FIG. 1, input/output elements 102 are located around the periphery of chip 100. If desired, the device 100 input/output elements 102 may form one or more columns of input/output elements that are located anywhere on the device (e.g., distributed evenly across the width of the device). If desired, input/output elements 102 may form one or more rows of input/output elements (e.g., distributed across the height of the device). If desired, input/output elements 102 may form islands of input/output elements that are distributed over the surface of the device or clustered in selected areas.

In scenarios where integrated 100 is a programmable logic device (PLD), core logic 104 may include a two-dimensional array of functional blocks, including logic array blocks (LABs) 110 and other functional blocks, such as random access memory (RAM) blocks 130 and configurable specialized processing blocks such as specialized processing blocks (SPB) 120, as examples. Functional blocks such as LABs 110 may include smaller programmable regions (e.g., logic elements, configurable logic blocks, or adaptive logic modules) that receive input signals and perform custom functions on the input signals to produce output signals.

Programmable logic device 100 may contain programmable memory elements. Memory elements may be loaded with configuration data (also called programming data) using input/output elements (IOEs) 102. Once loaded, the memory elements each provide a corresponding static control signal that controls the operation of an associated functional block (e.g., LABs 110, SPB 120, RAM 130, or input/output elements 102).

In a typical scenario, the outputs of the loaded memory elements are applied to the gates of metal-oxide-semiconductor transistors in a functional block to turn certain transistors on or off and thereby configure the logic in the functional block including the routing paths. Programmable logic circuit elements that may be controlled in this way include parts of multiplexers (e.g., multiplexers used for forming routing paths in interconnect circuits), look-up tables, logic arrays, AND, OR, NAND, and NOR logic gates, pass gates, etc.

The memory elements may use any suitable volatile and/or non-volatile memory structures such as random-access-memory (RAM) cells, fuses, antifuses, programmable read-only-memory memory cells, mask-programmed and laser-programmed structures, combinations of these structures, etc. Because the memory elements are loaded with configuration data during programming, the memory elements are sometimes referred to as configuration memory, configuration RAM (CRAM), configuration memory elements, or programmable memory elements.

If desired, device 100 may include programmable interconnect circuitry such as vertical routing channels 140 (e.g., interconnects formed along a vertical axis of device 100) and horizontal routing channels 150 (e.g., interconnects formed along a horizontal axis of device 100). Each routing channel may include at least one track to route at least one wire, for example. If desired, the interconnect circuitry may include double data rate interconnections and/or single data rate interconnections.

This example is merely illustrative. In general, any other desired routing topologies may be formed on device 100. For example, the routing topology may include diagonal wires, horizontal wires, and vertical wires along different parts of their extent, and/or wires that are perpendicular to the device plane (e.g., in scenarios where device 100 is a three dimensional integrated circuit). The routing topology may include global wires that span substantially all of device 100, fractional global wires such as wires that span part of device 100, staggered wires of a particular length, smaller local wires, or any other suitable interconnection resources. If desired, the functional blocks of integrated circuit 100 may be arranged in one or more levels or layers in which multiple functional blocks are interconnected to form still larger blocks.

Figure 2:
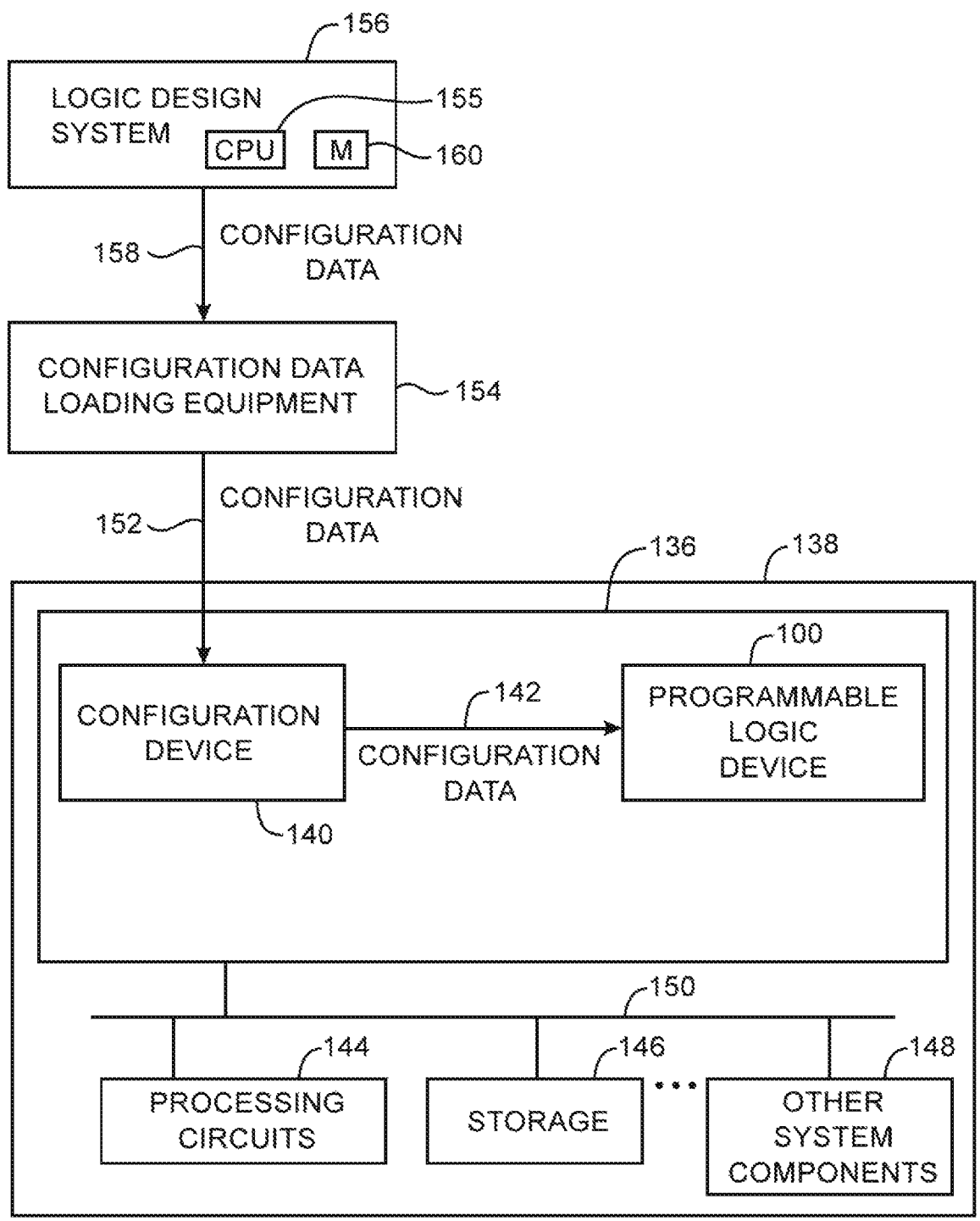
FIG. 2 is an illustrative diagram showing how configuration data may be generated by a logic design system and loaded into a programmable device in accordance with an embodiment of the present invention.

The various structures and components that are included in an integrated circuit can be designed using a circuit design system. An illustrative system environment for device 100 is shown in FIG. 2. Device 100 may, for example, be mounted on a board 136 in a system 138. In general, programmable logic device 100 may receive configuration data from programming equipment or from other suitable equipment or device. In the example of FIG. 2, programmable logic device 100 is the type of programmable logic device that receives configuration data from an associated integrated circuit 140. With this type of arrangement, circuit 140 may, if desired, be mounted on the same board 136 as programmable logic device 100. Circuit 140 may be an erasable-programmable read-only memory (EPROM) chip, a programmable logic device configuration data loading chip with built-in memory (sometimes referred to as a configuration device), or other suitable device. When system 138 boots up (or at another suitable time), the configuration data for configuring the programmable logic device may be supplied to the programmable logic device from device 140, as shown schematically by path 142. The configuration data that is supplied to the programmable logic device may be stored in the programmable logic device in its configuration random-access-memory elements.

System 138 may include processing circuits 144, storage 146, and other system components 148 that communicate with device 100. The components of system 138 may be located on one or more boards such as board 136 or other suitable mounting structures or housings and may be interconnected by buses and other electrical paths 150. If desired, programmable device 100 may be loaded with configuration data without mounting device 100 and/or configuration device 140 to board 136 (e.g., using any desired configuration data loading equipment).

Configuration device 140 may be supplied with the configuration data for device 100 (sometimes referred to herein as target circuit or target device 100) over a path such as path 152. Configuration device 140 may, for example, receive the configuration data from configuration data loading equipment 154 or other suitable equipment that stores this data in configuration device 140. Device 140 may be loaded with data before or after installation on board 136.

It can be a significant undertaking to design and implement a desired (custom) logic circuit in a programmable logic device. Logic designers therefore generally use logic design systems based on computer-aided-design (CAD) tools to assist them in designing circuits. A logic design system can help a logic designer design and test complex circuits for a system. When a design is complete, the logic design system may be used to generate configuration data for electrically programming the appropriate programmable logic device.

As shown in FIG. 2, the configuration data produced by a logic design system 156 (sometimes referred to herein as logic design equipment 156, logic design computer 156, logic design processor 156, logic design computing equipment 156, logic design circuitry 156, or data stream generation circuitry 156) may be provided to equipment 154 over a path such as path 158. Equipment 154 provides the configuration data to device 140, so that device 140 can later provide this configuration data to the programmable logic device 100 over path 142. System 156 may be based on one or more computers and one or more software programs. In general, software and data may be stored on any computer-readable medium (storage) in system 156 and is shown schematically as storage 160 in FIG. 2. System 156 may include processing circuitry in the form of one or more processors such as central processing unit (CPU) 155. In general, any desired processing circuitry may be formed on system 156.

In a typical scenario, logic design system 156 is used by a logic designer to create a custom circuit (logic) design. For example, the logic designer may provide input commands to logic design system 156 (e.g., by selecting on screen commands displayed on a display screen, by entering commands using a user input device such as a mouse and/or keyboard, etc.). The system 156 produces corresponding configuration data which is provided to configuration device 140. Upon power-up, configuration device 140 and data loading circuitry on programmable logic device 100 are used to load the configuration data into CRAM cells on device 100. Device 100 may then be used in normal operation of system 138. The example of FIG. 2 is merely illustrative. In general, any desired system may be used to load configuration data generated by logic design system 156 onto programmable logic device 100.

Figure 3:
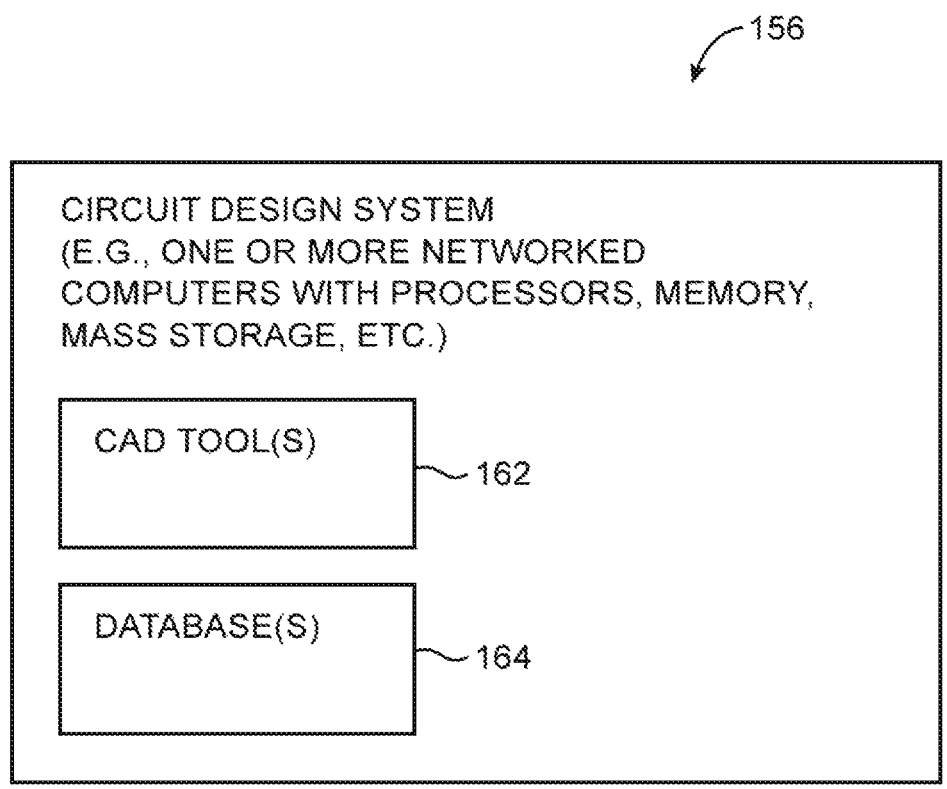
FIG. 3 is a diagram of a circuit design system that may be used to design integrated circuits in accordance with an embodiment.

An illustrative circuit (logic) design system 156 in accordance with the present invention is shown in FIG. 3. System 156 may be based on one or more processors such as personal computers, workstations, etc. The processor(s) may be linked using a network (e.g., a local or wide area network). Memory in these computers or external memory and storage devices such as internal and/or external hard disks may be used to store instructions and data.

Software-based components such as computer-aided design tools 162 and databases 164 reside on system 156. During operation, executable software such as the software of computer aided design tools 162 runs on the processor(s) of system 156. Databases 164 are used to store data for the operation of system 156. In general, software and data may be stored on any computer-readable medium (storage) in system 156. Such storage may include computer memory chips, removable and fixed media such as hard disk drives, flash memory, compact discs (CDs), digital versatile discs (DVDs), blu-ray discs (BDs), other optical media, and floppy diskettes, tapes, or any other suitable memory or storage device(s). When the software of system 156 is installed, the storage of system 156 has instructions and data that cause the computing equipment in system 156 to execute various methods (processes). When performing these processes, the computing equipment is configured to implement the functions of the circuit design system.

The computer aided design (CAD) tools 162, some or all of which are sometimes referred to collectively as a CAD tool or an electronic design automation (EDA) tool, may be provided by a single vendor or by multiple vendors. Tools 162 may be provided as one or more suites of tools (e.g., a compiler suite for performing tasks associated with implementing a circuit design in a programmable logic device) and/or as one or more separate software components (tools). Database(s) 164 may include one or more databases that are accessed only by a particular tool or tools and may include one or more shared databases. Shared databases may be accessed by multiple tools. For example, a first tool may store data for a second tool in a shared database. The second tool may access the shared database to retrieve the data stored by the first tool. This allows one tool to pass information to another tool. Tools may also pass information between each other without storing information in a shared database if desired.

Figure 4:
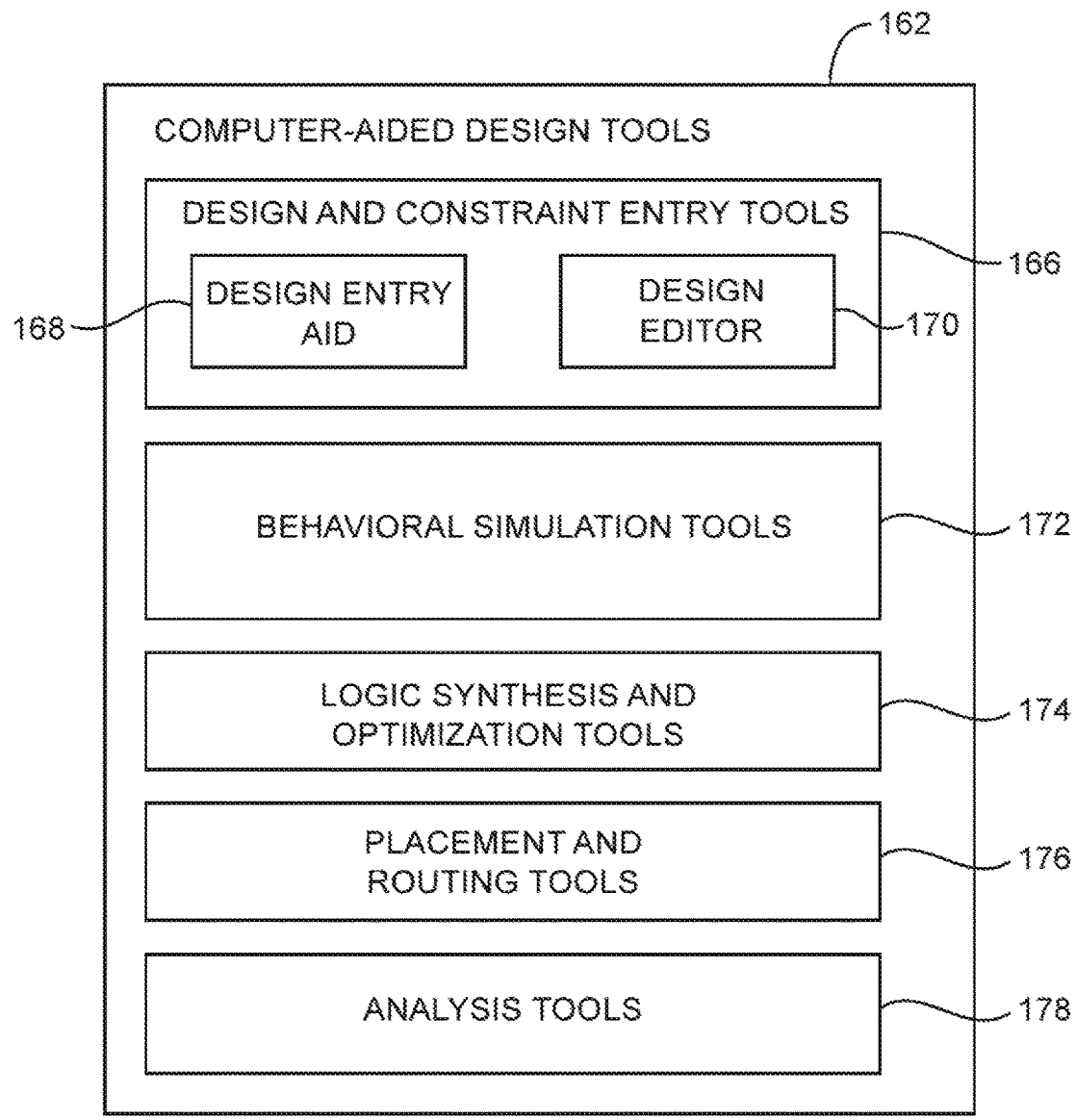
FIG. 4 is a diagram of illustrative computer-aided design (CAD) tools that may be used in a circuit design system in accordance with an embodiment.

Illustrative computer aided design tools 162 that may be used in a circuit design system such as circuit design system 156 of FIG. 3 are shown in FIG. 4.

The design process may start with the formulation of functional specifications of the integrated circuit design (e.g., a functional or behavioral description of the integrated circuit design). A circuit or logic designer may specify the functional operation of a desired circuit design using design and constraint entry tools 166. Design and constraint entry tools 166 may include tools such as design and constraint entry aid 168 and design editor 170. Design and constraint entry aids such as aid 168 may be used to help a circuit designer locate a desired design from a library of existing circuit designs and may provide computer-aided assistance to the circuit designer for entering (specifying) the desired circuit design.

As an example, design and constraint entry aid 168 may be used to present screens of options for a user. The user may click on on-screen options to select whether the circuit being designed should have certain features. Design editor 170 may be used to enter a design (e.g., by entering lines of hardware description language code), may be used to edit a design obtained from a library (e.g., using a design and constraint entry aid), or may assist a user in selecting and editing appropriate prepackaged code/designs.

Design and constraint entry tools 166 may be used to allow a circuit designer to provide a desired circuit design using any suitable format. For example, design and constraint entry tools 166 may include tools that allow the circuit designer to enter a circuit design using truth tables. Truth tables may be specified using text files or timing diagrams and may be imported from a library. Truth table circuit design and constraint entry may be used for a portion of a large circuit or for an entire circuit.

As another example, design and constraint entry tools 166 may include a schematic capture tool. A schematic capture tool may allow the circuit designer to visually construct integrated circuit designs from constituent parts such as logic gates and groups of logic gates. Libraries of preexisting integrated circuit designs may be used to allow a desired portion of a design to be imported with the schematic capture tools.

If desired, design and constraint entry tools 166 may allow the circuit designer to provide a circuit design to the circuit design system 156 using a hardware description language such as Verilog hardware description language (Verilog HDL), Very High Speed Integrated Circuit Hardware Description Language (VHDL), SystemVerilog, or a higher-level circuit description language such as OpenCL or SystemC, just to name a few. The designer of the integrated circuit design can enter the circuit design by writing hardware description language code with editor 170. Blocks of code may be imported from user-maintained or commercial libraries if desired.

After the design has been entered using design and constraint entry tools 166, behavioral simulation tools 172 may be used to simulate the functional performance of the circuit design. If the functional performance of the design is incomplete or incorrect, the circuit designer can make changes to the circuit design using design and constraint entry tools 166. The functional operation of the new circuit design may be verified using behavioral simulation tools 172 before synthesis operations have been performed using tools 176. Simulation tools such as behavioral simulation tools 172 may also be used at other stages in the design flow if desired (e.g., during logic synthesis). The output of the behavioral simulation tools 172 may be provided to the circuit designer in any suitable format (e.g., truth tables, timing diagrams, etc.).

Once the functional operation of the circuit design has been determined to be satisfactory, logic synthesis and optimization tools 174 may generate a gate-level netlist of the circuit design, for example using gates from a particular library pertaining to a targeted process supported by a foundry, which has been selected to produce the integrated circuit. Alternatively, logic synthesis and optimization tools 174 may generate a gate-level netlist of the circuit design using gates of a targeted programmable logic device such as device 100 (i.e., in the logic and interconnect resources of a particular programmable logic device product or product family).

Logic synthesis and optimization tools 174 may optimize the design by making appropriate selections of hardware to implement different logic functions in the circuit design based on the circuit design data and constraint data entered by the logic designer using tools 166. Tools 174 may optimize the design while ensuring that device constraints are satisfied. Such device constrains may include legality rules (sometimes referred to herein as legality constraints) and timing constraints. The legality rules may specify what placement of logic elements within the design and what interconnections are legal or illegal (e.g., which placements and interconnections satisfy or do not satisfy the legality rules). Examples of legality constraints that may be imposed include rules about where certain logic elements can be placed, rules dictating that multiple elements cannot share a single location on the design, clustering rules, rules dictating how elements can be connected, clocking rules (e.g., constraints on how each logic element in the design is clocked or how many clocks each logic cluster may receive), packing rules, or other desired legality constraints.

The timing constraints may provide constraints on timing within the design. The timing constraints may, for example, include rules limiting the maximum allowable signal propagation delay between each element in the logic design or on a combinational path connecting the logic elements. The legality rules and timing constraints may be provided by a logic designer operating system 162, by a manufacturer of integrated circuit 100 or system 138, by regulatory standards, etc. Tools 174 may perform optimizations to the logic design while ensuring that any optimizations maintain or satisfy both the legality constraints and the timing constraints.

After logic synthesis and optimization using tools 174, the circuit design system may use tools such as placement and routing tools 176 to perform layout and routing operations). Placement and routing tools 176 may create orderly and efficient implementations of circuit designs for any targeted integrated circuit (e.g., for a given programmable integrated circuit such as a field-programmable gate array (FPGA)).

Tools such as tools 174 and 176 may be part of a compiler suite (e.g., part of a suite of compiler tools provided by a programmable logic device vendor). In accordance with the present invention, tools such as tools 174, 176, and 178 may also include timing analysis tools such as timing estimators. This allows tools 174 and 176 to satisfy performance requirements (e.g., timing requirements) before actually producing the integrated circuit. As an example, tools 174 and 176 may partition data paths into subsets of data paths and instantiate additional cascaded processing and storage circuitry for each newly created subset of data paths. If desired, tools 174 and 176 may register pipeline selected paths in order to provide for higher clock rates in exchange for increased latency.

After a layout implementation of the desired circuit design has been generated using placement and routing tools 176, the implementation of the design may be analyzed and tested using analysis tools 178. After satisfactory optimization operations have been completed using tools 162 and depending on the targeted integrated circuit technology, tools 120 may produce a mask-level layout description of the integrated circuit or configuration data for programming the programmable logic device.

When performing synthesis and optimization, the logic design is specified by the logic designer in an HDL file or other formats as specified at design constraint entry tools 166. The logic synthesis and technology mapping process map the optimized design into basic logic elements (BLEs) which may include, for example, look-up-tables (LUTs), latches such as flip-flops, or combinations of LUTs and flip-flops, block RAMS, DSPs, carry chains, etc. The BLEs in the synthesized netlist are placed at particular locations and the BLEs are interconnected in a particular way so as to implement desired Boolean logic functions (e.g., AND gates, NOR gates, OR gates, XOR gates, NAND gates, pass gates, etc.) in the design.

Each possible arrangement/placement of the BLEs may have corresponding timing implications (e.g., some arrangements may involve longer signal propagation delays as signals pass through the BLEs than others), may occupy different amounts of space within the target device (e.g., some arrangements may require more area than other arrangements), and may consume different amounts of power in the target device when implemented. The optimization operations may optimize these factors to identify an optimal arrangement for the BLEs to implement a desired logic design. Legalization operations may be performed to ensure that the optimal arrangement also satisfies legality constraints. If the optimal arrangement does not satisfy the legality constraints, a different arrangement must be used until legality is satisfied. The process of testing whether the design satisfies the legality constraints and adjusting the design until the legality constraints are satisfied is sometimes referred to herein as legalization.

The placement operations may involve arranging (packing or clustering) the BLEs into adaptive logic modules (ALMs). ALMs may serve as discrete logical elements that include one or more BLEs arranged and interconnected in a predetermined manner. The placement operations may further involve arranging (packing or clustering) the ALMs into logic array blocks (LABs) 110 as shown in FIG. 1. The LABs may serve as discrete logical elements that include one or more ALMs arranged and interconnected in a predetermined manner.

Figure 5:
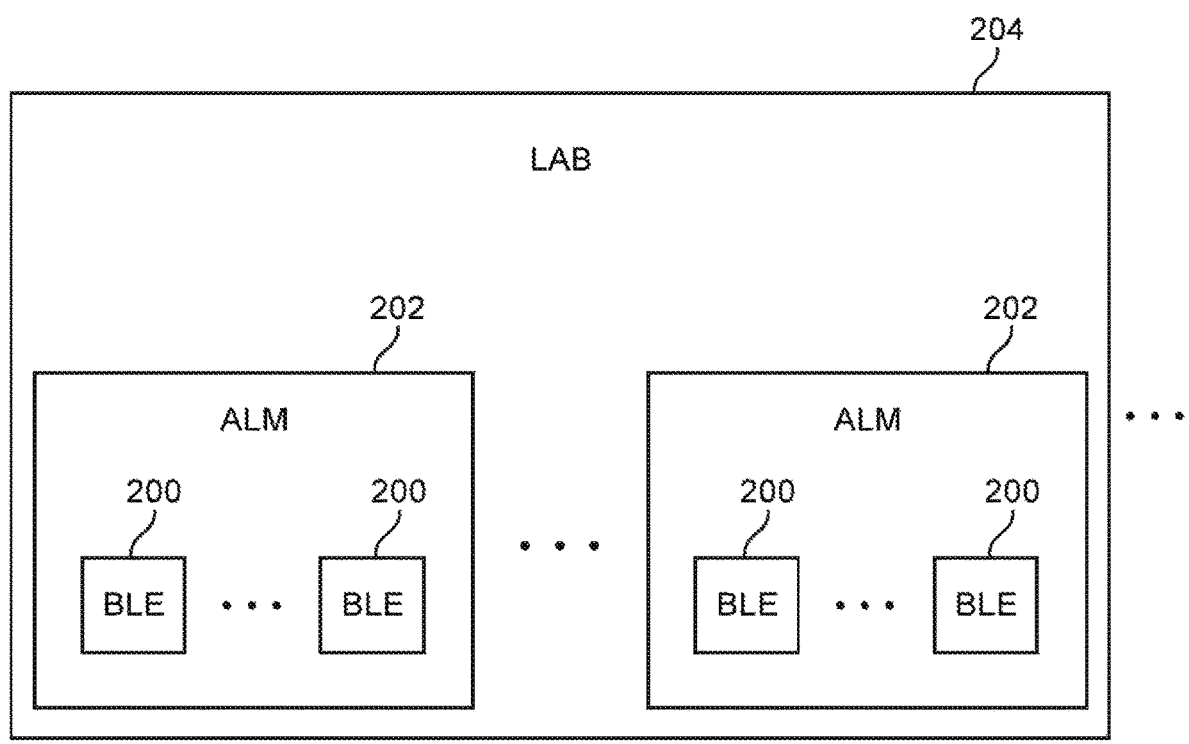
FIG. 5 is an illustrative diagram showing how basic logic elements may be clustered into adaptive logic modules and logic array blocks in a synthesized logic design in accordance with an embodiment.

FIG. 5 is an illustrative diagram showing how BLEs may be packed within LABs on device 100. As shown in FIG. 5, a number of BLEs may be packed into a corresponding ALM 202. Each ALM may include other predetermined circuitry for interconnecting the BLEs within that ALM. As one example, each ALM may include four or more BLEs. Multiple ALMs 202 may be packed into a corresponding LAB 204. Each LAB 204 may include other predetermined circuitry for interconnecting the ALMs within that LAB. As one example, each LAB may include ten ALMs. Each ALM may include, for example, six BLEs such as two look-up tables and four flip-flops. However, in general, any number of ALMs may be formed in each LAB and any number of BLEs may be formed in each ALM, as dictated by the target architecture.

The LABs may be subject to legalization constraints (e.g., packing or clustering constraints, constraints regarding the legal placement of the LABs, etc.). The optimization operations may identify an optimal arrangement of BLEs 200 packed within ALMs 202 and LABs 204 while ensuring that all legality constraints imposed by the FPGA architecture are satisfied.

In some scenarios, physical synthesis for the entire logic design is performed and a corresponding final netlist is saved to disk. In such a scenario, placement and clustering operations are only performed a single time prior to the physical synthesis. A legalization operation is then performed after the physical synthesis operation is performed for the entire design (e.g., after the final netlist is saved). If the synthesized design does not satisfy the legalization constraints, the synthesized design (e.g., the saved final netlist) is scrapped and the original netlist is restored.

It should be noted that even if many of the physical synthesis transforms could have been successfully legalized, the ones that cannot be legalized correctly contribute to rejecting all the transforms. If the legalization process succeeds, then the design is verified whether the timing constraints are still satisfied after the legalization. If the timing of the design has deteriorated, then all of the physical synthesis transforms are rejected and the design is restored to its original form. Otherwise, all physical synthesis transforms are accepted. This process can lead to excessive runtimes required to synthesize and implement a satisfactory logic design on target device 100 (e.g., especially when only a small number of the components in the synthesized design fail legalization or timing). Moreover, physical synthesis becomes less effective in improving the timing of a design when using such batch methods for placement legalization and timing analysis.

Figure 6:
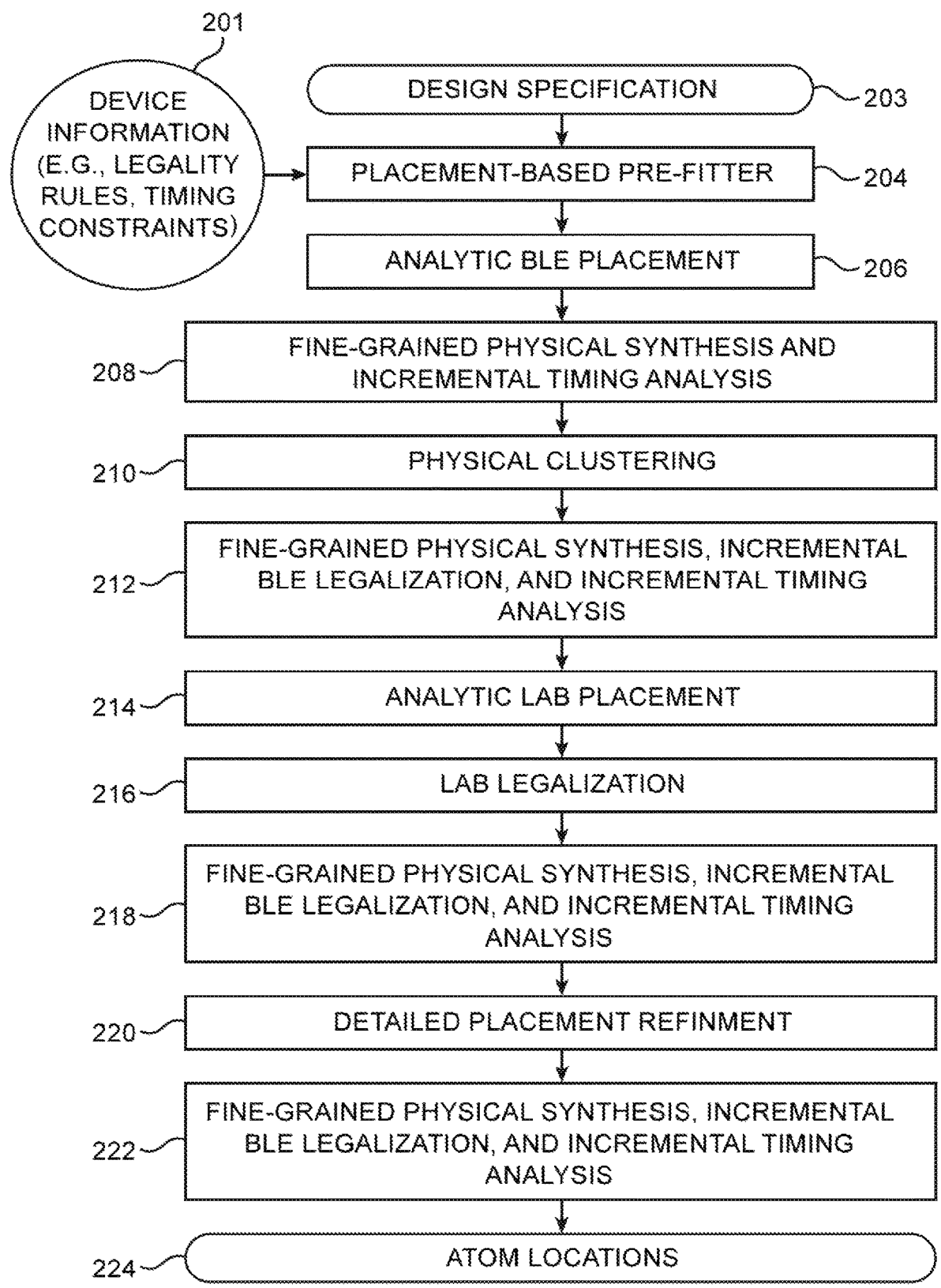
FIG. 6 is a flow chart of illustrative steps for performing multiple incremental physical synthesis, timing analysis, and legalization operations on a logic design before outputting a final synthesized logic design for implementation on an integrated circuit in accordance with an embodiment.

In order to improve the efficiency with which an optimal and legal final logic design is synthesized for logic device 100, equipment 156 may perform multiple incremental physical synthesis, incremental timing analysis, and incremental legalization, operations on the logic design. For example, equipment 156 may perform multiple incremental physical synthesis, incremental timing analysis, and incremental legalization operations after performing different adjustments to the logic design prior to saving a final, legal, and optimized netlist for the design. Illustrative operations involved in using tools 162 of FIG. 4 to efficiently produce a final synthesized logic design (e.g., a final netlist) using incremental physical synthesis, incremental timing analysis, and incremental legalization are shown in FIG. 6. The operations described in FIG. 6 may, for example, be performed by tools on equipment 156 such as a compiler having placement and routing tools 176 of FIG. 4.

As shown in FIG. 6, equipment 156 may identify a design specification 203 and device information 201. Design specification 203 may be the output of a logic synthesis operation that takes as its input a logic designer's design specification (e.g., a register transfer level (RTL) description, etc.). Specification 200 may be a synthesized version of the RTL description that identifies placeable logic elements (e.g., LUTs, FFs, Block RAMS, DSPs, etc.). Design specification 203 may be provided as an input to the incremental synthesis operations shown in FIG. 6. Design specification 203 may sometimes be referred to as an atom netlist.

Device information 201 may include target information associated with device 100. Device information 201 may include, for example, layout and resource information for target device 100. This information is generally dictated by the particular architecture of the target device 100 that is being programmed. Information 201 may include resource and legality information for target device 100. Information 201 may be provided by a manufacturer, vendor, or provider of target device 100, for example. The steps of FIG. 6 may be performed to "fit" the user's (e.g., the logic designer's) design onto the FPGA fabric of target device 100 by utilizing the FPGA resources and ensuring that the design is legal on the FPGA physical layout (e.g., as specified by information 201) while maintaining satisfactory or optimal timing in accordance with the user-specified timing constraints.

Other constraints may be provided to equipment 156 for performing placement operations if desired. Such constraints may include area use, power consumption, timing constraints such as delay minimization, clock frequency optimization, legality rules for the physically synthesized design (e.g., legality rules for the ALMs and LABs in the design), or any combination thereof. These constraints can be provided for individual data paths, portions of individual data paths, portions of a design, or for the entire design. For example, the constraints may be provided in a constraint file or through user input (e.g., using the design and constraint entry tools 166). The timing constraints are optimization constraints that are sometimes described herein as examples. The timing constraints may include, for example, constraints on timing delays (e.g., signal propagation delays) allowed for signals propagating between logic elements (e.g., BLEs, ALMs, and/or LABs) in the logic design (e.g., rules specifying that timing delays between logic elements should be below a threshold timing delay, etc.).

These constraints may target the entire circuit design or portions of the circuit design. For example, some constraints may be defined globally and thus be applicable to the entire circuit design. Other constraints may be assigned locally and thus be applicable only to the corresponding portions of the circuit design (e.g., to individual BLEs, ALMs, or LABs in the design). If desired, multiple different constraints may target the same portion of the circuit design. Such constraints may be read during the operations of FIG. 6 so that tools 162 may optimize the logic, placement, and routing of the design to satisfy the constraints.

At step 204, equipment 156 (e.g., CAD tools 162) may perform placement-based pre-fitter operations on design specification 200. Equipment 156 may identify BLEs, ALMs, and LABs to use in implementing design 203 such that constraints in device information 201 are satisfied. The placement-based pre-fitter operations may involve identifying peripheral block placements such as input-output block placements (e.g., placements for BLEs associated with IO elements 102 of FIG. 1) for the logic design. The pre-fitter operations may, if desired, involve assigning clock signals to portions (regions) of the logic design.

At step 206, equipment 156 may perform analytic BLE placement operations. The analytic BLE placement operations may involve identifying locations within the logic resources of target device 100 at which to place the identified BLEs (e.g., as identified at step 204). The placement of BLEs within the logic design for device 100 is not a legal placement (e.g., the legality constraints in device information 202 need not be satisfied by the placement of the BLEs performed at step 206). Equipment 156 identifies placement locations for each of the BLEs in design 203. If desired, equipment 156 may identify the placement locations based on congestion, timing, usage, or other metrics associated with design 203. The BLEs at this stage in processing are not yet clustered into ALMs and LABs, are not yet legal, and may not yet have optimal timing or placements, for example.

At step 208, equipment 156 may perform a first incremental (e.g., fine-grained) physical synthesis and incremental timing analysis operation on the logic design having the placed BLEs (e.g., as placed at step 206). Equipment 156 may perform physical synthesis transform operations on the placed BLEs (sometimes referred to herein as incremental physical synthesis transform operations, physical synthesis transforms, or physical synthesis transformations). Equipment 156 may perform timing analysis operations and, if desired, the physical synthesis transform operations may be performed based on the timing analysis operations (e.g., an incremental timing analysis on the placed BLEs).

As one example, equipment 156 may adjust the locations of the BLEs to satisfy timing constraints in information 201. For example, equipment 156 may adjust the locations of the BLEs, incrementally analyze the timing of the adjusted BLEs, and repeat this process until any timing delays between the BLEs in the adjusted design are acceptable (e.g., below corresponding threshold times). Each physical synthesis transform operation performed during this step modifies the corresponding netlist for the design. Physical synthesis also performs incremental placement operations for any BLEs in the netlist for the design.

At step 210, equipment 156 may perform physical clustering operations (e.g., after the BLEs have been placed at timing-optimal locations at step 208). The physical clustering operations may involve clustering the placed BLEs into ALMs that are further packed into LABs (e.g., as shown in FIG. 5). The clustering may be based on the physical locations of the placed BLEs, if desired (e.g., BLEs that are located near to each other in the placed design may be clustered together within a corresponding LAB whereas BLEs that are relatively far apart in the design are not clustered together within a LAB).

Performing the clustering operations may change the physical location of the BLEs within the logic design. Consider an example in which a first BLE is placed at a location (X,Y) and a second BLE is placed at a location (X+3,Y) in the design (e.g., while processing step 208). These BLEs may be clustered together to form a single LAB centered at a position other than the position of the first and second BLEs, such as the location (X+1.5,Y) that is interposed between the original locations of the first and second BLEs. This may move the BLEs to other locations on the floorplan that are different from the locations identified at step 208.

Because the location of the BLEs may change upon clustering, the timing associated with the new locations of the BLEs needs to be analyzed to ensure that the timing constraints are satisfied. In addition, the new locations of the clustered BLEs have not yet been legalized (e.g., the clusters themselves are legal in terms of connection and other ALM/LAB packing rules but are not yet necessarily placed legally on the floorplan of device 100).

At step 212, equipment 156 may perform an incremental physical synthesis, incremental timing analysis, and incremental legalization operation on the logic design having the clustered BLEs. Equipment 156 may perform physical synthesis transforms on one or more of the clustered BLEs (e.g., the BLEs, the ALMS, or the LABs in the clustered design) based on timing analysis operations. If the new locations of the clustered BLEs do not satisfy timing constraints (e.g., if there is excessive timing delay between the BLEs), the BLEs may be re-clustered into different LABs or ALMs, the timing may be incrementally analyzed, and this process may be repeated until the timing of the design improves or the timing constraints are satisfied. This process may involve determining whether the clustering of the BLEs satisfies packing legalization constraints. If the clustering of the BLEs does not satisfy the packing legalization constraints, the BLEs may be re-clustered until both the timing is optimized (improved) and the packing legalization constraints are satisfied. The example in which the BLEs are re-clustered is merely illustrative and, in general, any desired physical synthesis transforms may be performed at this step.

Re-clustering the BLEs (or performing other physical synthesis transforms at this step) may place the BLEs at new locations within the design. These new locations may be locations that satisfy cluster legality (e.g., such that the clusters are legally packed) while also improving the timing of the design. Re-clustering BLEs may affect the packing legality of other BLEs in the design. Thus, this process may be repeated recursively until each of the re-clustered BLEs (LABs) are legally packed. If desired, some of the LABs may be re-packed (e.g., some of the BLEs within the LABs may be deleted or moved to other LABs or new BLEs may be moved into the LABs) and/or some of the LABs or ALMs may be deleted from the logic design at this step. Performing physical synthesis transform operations at this step may modify the netlist corresponding to the logic design.

The locations of the newly generated LABs (e.g., the LABs after the BLEs have been re-clustered) may not be the optimal locations with regards to the global timing of the design. At step 214, equipment 156 may perform analytic LAB placement operations on the logic design. The analytic LAB placement operations may involve moving the clustered BLEs (e.g., the entire corresponding LABs) to other locations in the design (e.g., based on timing, congestion, wiring usage, or other metrics). This may involve moving both the entire LAB and the ALMs and BLEs clustered within the LAB. Equipment 156 may move an entire LAB to a location that satisfies timing requirements optimizes the timing of the design identified by constraints 201 (e.g., to a location having minimal timing delay relative to the other LABs or to the closest location that results in a timing delay that is less than a threshold time). Analytic LAB placement may also optimize the wiring that is used, may optimize routing congestion, and may minimize LAB placement overlap. In the example where a given re-clustered LAB is centered at location (X+1.5,Y), equipment 156 may determine that the design would have less timing delay if that LAB were centered at location (X+1.5,Y+1). Equipment 156 may then move the LAB to location (X+1.5,Y+1). This process may be performed for all LABs in the design.

However, the new locations of the LABs may not necessarily satisfy the chip legality constraints (e.g., the LAB locations after analytic LAB placement may have overlap and may thus fail chip legality constraints in device information 202). At step 216, equipment 156 may determine whether the new LAB locations satisfy legality constraints identified by information 201. If the legality constraints are not satisfied, the LABs may be moved until legal locations are found. For example, new LAB location (X+1.5,Y+1) may overlap with an existing LAB in the design that cannot be moved. In this scenario, the given LAB may be moved (e.g., "snapped") to a different location such as (X+2,Y+2) that is unoccupied and therefore legal. By repeating this process for all LABs in the design, equipment 156 can satisfy the legality constraints for each of the LABs across the entire logic design (e.g., across the entire floorplan of target device 100).

At step 218, equipment 156 may perform another incremental physical synthesis, incremental timing analysis, and incremental legalization operation on the design to modify the netlist and re-synthesize and re-place pieces of logic incrementally to address any timing constraint violations and while ensuring that chip legality is satisfied. In this step, the LABs in the design may already satisfy all chip legality constraints prior to performing the incremental physical synthesis, timing analysis, and legalization operation (e.g., because the LABs were legalized at step 216 prior to performing step 218). If the new (legal) LAB placements do not satisfy timing constraints, equipment 156 may perform additional physical synthesis transforms (e.g., based on timing analysis operations) to improve the timing of the design, while satisfying legality constraints.

For example, equipment 156 may move the LABs to new locations that satisfy both the timing constraints and the legality constraints (e.g., to a nearest free location that improves the timing delay). If a desired location to move a given LAB is full, a LAB at the desired location may be moved to another empty location on the design if possible. Step 218 may also modify the netlist to improve the timing of the design, while ensuring that the resulting ALMs and LABs in the entire design are legal. This process may be repeated recursively until each of the LABs are snapped to a legal location in the design, such that the timing of the design is improved. The logic design may now be legal (e.g., the placement of each of the BLEs, ALMs, and LABs in the design may satisfy the legality constraints in device information 201 as well as packing legality constraints).

At step 220, equipment 156 may perform detailed placement refinement operations on the legal logic design. For example, equipment 156 may fine tune the BLEs contained in the LABs as well as the placement of the LABs within the design so that any other desired constraints in information 201 are satisfied, and metrics such as the timing of the design, wiring usage, routing congestion, etc. are further improved.

At step 222, equipment 156 may perform another incremental physical synthesis, incremental timing analysis, and incremental legalization operation on the design to modify the netlist and re-synthesize and re-place pieces of logic incrementally to address any timing constraint violations and while ensuring that chip legality is satisfied. If the new (legal) LAB placements do not satisfy timing constraints, equipment 156 may perform additional physical synthesis transforms (e.g., based on timing analysis operations) until the timing of the design is improved, while satisfying ALM/LAB legality constraints and chip legality constraints. For example, equipment 156 may move the BLEs on timing-critical paths to new locations that improve the timing of the design, while satisfying the legality constraints (e.g., to a nearest free location that improves the critical path that is being optimized by physical synthesis). Step 222 may also modify the BLEs on the critical regions of the design and perform incremental legalization and incremental timing analysis to decide if the moves improve the timing of the design before accepting the moves. The moves are fine-grained because each move is analyzed in isolation before moving to the next move on the next critical region of the design.

Performing this final physical synthesis, timing analysis, and legalization operation may generate a final, physically synthesized, optimized, and legalized logic design 224. Logic design 224 may sometimes be referred to herein as the final placed logic design. Final logic design 224 may have optimal timing and legal placements (e.g., an acceptable timing having timing delays that are less than a threshold timing delay or a minimal timing delay of all possible designs for implementing specification 200). Final logic design 224 may be a data structure such as a netlist file (sometimes referred to herein as a final placed netlist), where each of the logic elements (e.g., BLEs, ALMs, and LABs) in the design have legal placement locations. Final logic design 224 may sometimes be referred to as an atom locations file.

By performing multiple, incremental physical synthesis, incremental timing analysis, and incremental legalization operations (e.g., by distributing the physical synthesis, timing analysis, and legalization operations across steps 212, 218, and 222), the logic design (netlist) may be incrementally altered and verified prior to outputting the final design. In this way, legalization for the design may be ensured after each adjustment to the logic design for satisfying the optimization (e.g., timing) constraints. This may allow adjustment to the design to be dynamically performed as they are needed during the physical synthesis operations. This prevents the need for rejecting or accepting an entire batch of changes such as in scenarios where a single physical synthesis and legalization step is performed after the final placed netlist is generated. This may reduce the overall time and processing power required for generating a final synthesized logic design for implementing on target device 100. Moreover, this fine-grained and incremental physical synthesis ensures that changes that can be legalized successfully can be accepted, independent of changes that cannot be legalized successfully (e.g., only changes that fail to legalize are rejected). The use of incremental timing analysis during physical synthesis also ensures that the timing of the design is (incrementally) updated only in cones of logic that are affected by the netlist changes made by physical synthesis. This significantly speeds-up the process for physical synthesis, as well as provides more fine-grained control on the changes.

The example of FIG. 6 in which three incremental synthesis, incremental timing analysis, and incremental legalization operations are performed is merely illustrative. In general, any desired number of incremental synthesis, timing analysis, and legalization operations may be performed (e.g., one operation, two operations, four operations, five operations, more than five operations, etc.). In general, any desired optimization constraints may be used in place of the timing constraints described in the example above. Any desired legalization rules (e.g., clocking rules, routing rules, control signal rules, etc.) may be used in place of the legality rule against overlapping logic elements described in the example above. If desired, steps 214-222 may be omitted and the final netlist may be saved after processing step 212 (e.g., because the logic design after step 212 is already legal). In another suitable arrangement, the final netlist may be saved after processing step 216 (e.g., steps 218-222 may be omitted) or may be saved after processing step 218 (e.g., steps 220-222 may be omitted).

Figure 7:
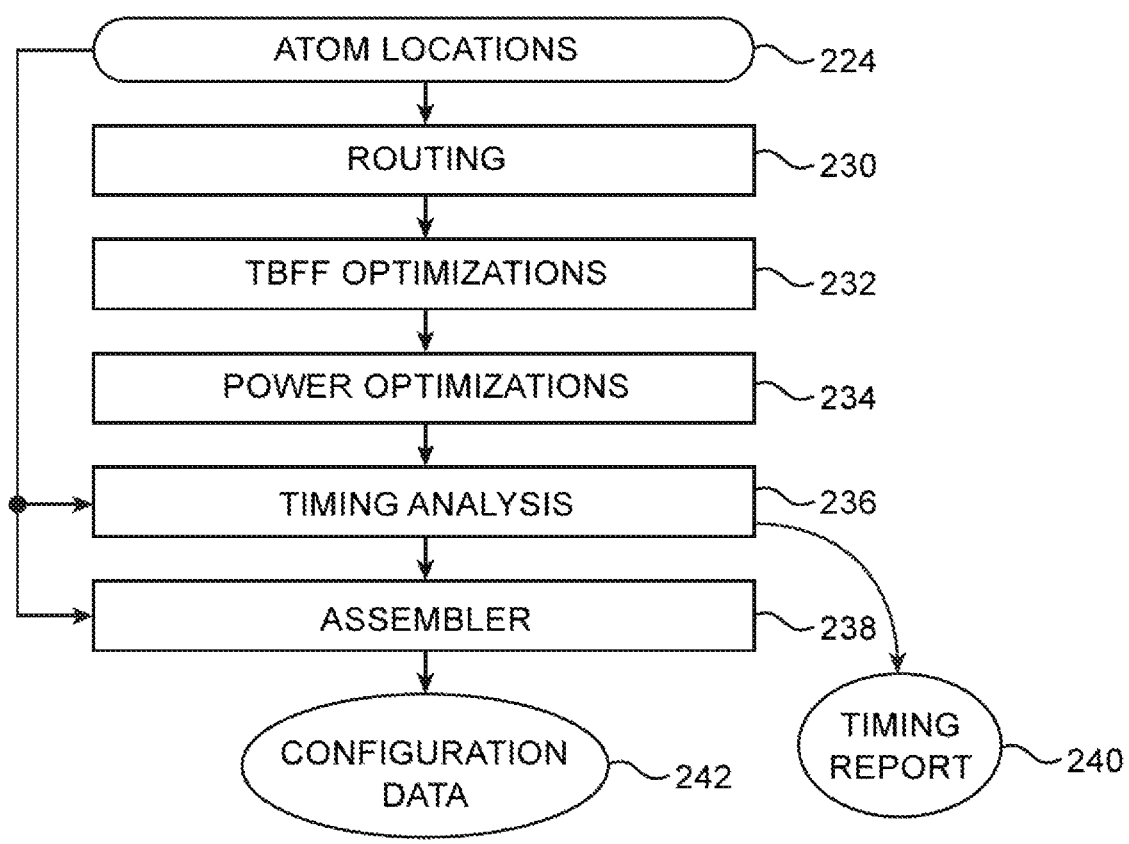
FIG. 7 is a flow chart of illustrative steps for generating configuration data based on a final synthesized logic design for loading onto an integrated circuit in accordance with an embodiment.

Illustrative operations involved in using equipment 156 of FIG. 4 to generate configuration data for configuring target integrated circuit 100 based on incrementally synthesized and legalized final logic design 224 are shown in FIG. 7.

As shown in FIG. 7, equipment 156 may perform routing operations on physically synthesized logic design 224 at step 230. For example, a compiler engine on placement and routing tools 176 (FIG. 4) may perform the routing operations on the synthesized, placed, optimized, and legalized logic design. Routing may include allocating routing resources on target device 100 to provide interconnections between logic gates, logic elements, and other components on target device 100. Routability optimization is performed on the placed logic design. Routability optimization may reduce the amount of wiring used to connect components in the placed logic design. Routability optimization may include performing fanout splitting, logic duplication, logical rewiring, or other procedures.

At optional step 232, equipment 156 may perform time borrowing flip flop timing (TBFF) optimizations to ensure optimal time borrowing across critical flip flops in the design. Some FPGA architectures support special flip-flops, called TBFFs to allow for such optimizations.

At optional step 234, equipment 156 may perform power optimizations on the design. The power optimizations may ensure that power consumption by the design is optimal (e.g., sufficiently low).

At step 236, equipment 156 may perform sign-off timing analysis on the design. The timing analysis may involve analyzing the timing of the design (e.g., to determine signal propagation delay times and other timing characteristics of the final design) across multiple corners and may generate a corresponding timing report such as report 240. Equipment 156 may provide timing report 240 to the logic designer to inform the logic designer of the timing of the final design (e.g., using display or monitor hardware, email reports, messaging, etc.). As the logic design has already been fully timing-optimized and legalized (e.g., prior to generating final netlist 224), no further optimizations or adjustments need be performed on the logic design in response to this timing analysis. In another suitable arrangement, additional optimizations such as optimizations with more accurate signoff multi-corner timing analysis, targeted and incremental fixup style optimizations, or any other desired optimizations or adjustments may be performed at this step.

At step 238, assembler 238 may generate programming files based on the timing analysis and based on final logic design 224. The programming file (sometimes referred to herein as an optimized program file) may include optimized configuration data 242 that includes a bit stream (e.g., a configuration data bit stream) used to program target device 100 (e.g., using configuration device 140 of FIG. 2).

The optimized data file (e.g., optimized configuration data 242) may be transmitted to configuration device 140. Configuration device 140 may load target device 100 with optimized configuration data 242. By programming device 100 with optimized configuration data 242, components on target device 100 are physically transformed to implement the optimized logic design.

Figure 8:
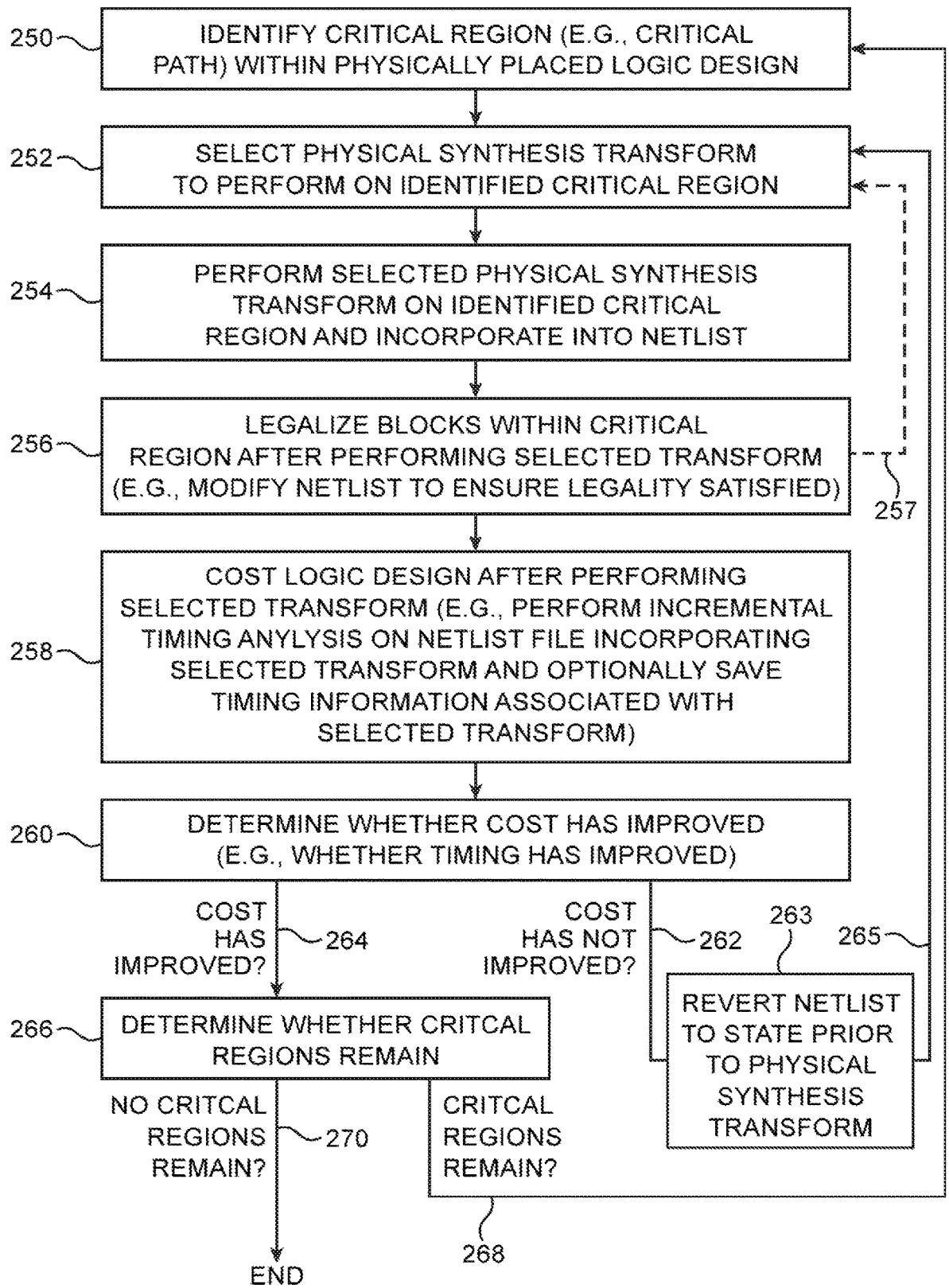
FIG. 8 is a flow chart of illustrative steps for performing an incremental physical synthesis, timing analysis, and legalization operation on a logic design in accordance with an embodiment.

FIG. 8 is a flow chart of illustrative steps that may be performed by equipment 156 to incrementally optimize, synthesize, incrementally timing analyze, and optionally legalize the logic design. The steps of FIG. 8 may, for example, be performed by equipment 156 while processing any of steps 208, 212, 218, or 222 of FIG. 6.

At step 250, equipment 156 may identify a critical region within the physically placed logic design. Equipment 156 may identify corresponding logic blocks (e.g., BLEs, ALMs, and/or LABs) within the identified critical region. The critical region may be an area in the design (e.g., a grouping of placed BLEs, ALMs, and/or LABs) or a critical path (e.g., a path of interconnected BLEs, ALMs, and/or LABs) that violates a timing constraint in constraints 201. For example, signal propagation delay within a critical region (e.g., along a critical path) may be greater than a minimum acceptable signal propagation delay threshold. In another suitable arrangement, the critical region may be any region in the logic design that has improvable timing or resource consumption (e.g., even if the critical region has acceptable timing there may still be an opportunity to improve the timing and provide a faster logic design for the target device).

At step 252, equipment 156 may select a physical synthesis transform to perform on the identified critical region (e.g., as identified at step 250). The physical synthesis transform may involve operation on a corresponding set of logic blocks within the placed logic design (e.g., a corresponding set of BLEs, ALMs, or LABs). The physical synthesis transform operation may be, for example, a local retiming operation (e.g., a RAM retiming operation, DSP retiming operation, forward retiming operation across combinational logic like LUTs and carry chains, and/or backward retiming operation across combinational logic like LUTs and carry chains), a slack equalization operation, a placement adjustment operation (e.g., adjustment to the physical locations of the corresponding BLE), a re-clustering or re-packing operation, a look-up table input rotation operation, a logic duplication operation, a Critical Path Re-synthesis (CPR) operation, a combination of these operations, or any other desired physical synthesis transform operations. If desired, the selected physical synthesis transform may involve generation of new BLEs, ALMs, or LABs and/or deletion of existing placed BLEs, ALMs, or LABs.

At step 254, equipment 156 may perform the selected physical synthesis transform on the identified critical region. For example, equipment 156 may perform the selected physical synthesis transform on the corresponding set of blocks (BLEs, ALMs, or LABs) within the critical region. If desired, the transform may also operate on logic blocks outside of the critical region. Any changes to the logic design caused by the physical synthesis transforms may be incorporated into the netlist. The physical synthesis transforms may not necessarily be a legal transformation (e.g., the transformation to the logic design may violate the legality constraints).

At step 256, equipment 156 may perform a legalization operation on the critical region after performing the selected physical synthesis transform to ensure that the legality constraints are satisfied. The legalization operation may involve minimally and incrementally adjusting the location of other logic blocks in the logic design to satisfy the legality constraints if the legality constraints are not satisfied after the selected physical synthesis transformation is performed. If moving other logic blocks in the logic design still does not satisfy the legality constraints, a different physical synthesis transform may be selected as shown by path 257. If the legality constraints are satisfied, processing may proceed to step 258. Step 256 may be omitted when performing step 208 of FIG. 6 (e.g., because step 208 does not involve legalization).

In one illustrative example, the selected physical synthesis transform may be a placement adjustment operation that adjusts the location of a placed BLE within the logic design. For example, a given BLE may be located at a position (X,Y) within the design. The BLE may lie within a critical region (e.g., the BLE may lie along a critical path having unsatisfactory timing). The selected physical synthesis transform may involve moving the BLE to a position (X,Y+1) in the logic design. Equipment 156 may perform the physical synthesis transform to move the BLE to position (X,Y+1) in the netlist.

Equipment 156 may legalize the BLE after moving the BLE to the new position in the logic design. For example, if location (X,Y+1) is empty, the BLE may satisfy legality rules specifying that only one logic block may be formed at a given location. If location (X,Y+1) is already occupied by a non-critical cell, equipment 156 may legalize the design by moving the logic block that is already at position (X,Y+1) to another location in the logic design (e.g., an unoccupied location that also satisfies the legality constraints) so that the given BLE can be legally moved to position (X,Y+1). If desired, equipment 156 may recursively move additional non-critical blocks in the design to ensure that legality is satisfied for each block that is required to be moved to accommodate the relocation of the given BLE.

In another example, the selected physical synthesis transform may be a logic duplication operation that generates new BLEs in the logic design. In this scenario, a given BLE may lie within a critical region having unsatisfactory timing. The given BLE may perform a desired operation for part of the design but may be required at its current location for another part of the logic design. The physical synthesis operation may generate a copy of the given BLE and may place the copy within the logic design at a selected location. The duplicated BLE may, for example, be placed at a location that is expected to improve the timing of the design, while still allowing the original BLE to remain at its current required location. Equipment 156 may legalize the newly generated BLE. For example, equipment 156 may move a logic block at the selected location for the newly generated BLE to a legal location in the design so that the newly generated BLE can then be placed at the desired location.

In yet another example, the selected physical synthesis transform may be a slack equalization transform performed on a flip-flop having an unbalanced timing margin. In this scenario, two look-up tables may be coupled in series with an input of a flip-flop. Each look-up table may generate a corresponding unit of delay for the design. The slack equalization transform may move the flip-flop and connect the flip-flop in series between each look-up table. This may equalize slack for the flip-flop across both sides of the flip-flop and may lead to an improvement in the overall timing for the design. This operation is also sometimes referred to as register retiming.

In scenarios where the physical synthesis transform is a look-up table input rotation transform, the transform may involve changing the connection of a critical path from a slower input of a corresponding look-up table (BLE) to a faster input of the look-up table. These examples are merely illustrative and, in general, any desired physical synthesis transforms may be performed and optionally legalized. The physical synthesis transforms may be performed on only logic blocks within the identified critical region or may involve logic blocks and resources from both within the critical region and outside of the critical region. Each physical synthesis transform may be incorporated into the netlist of the logic design.

At step 258, equipment 156 may cost the logic design after performing the selected physical synthesis transform. This may involve performing an incremental timing analysis operation on the logic design (netlist) that has been modified by the selected physical synthesis transform and optionally legalized. Incremental timing analysis updates the timing of the design only in cones of logic that are affected by the modified logic. For example, in a simple case, equipment 156 may cost the design by identifying signal propagation delays or other timing information in the critical region (or in the overall design) after the physical synthesis transform has been performed. In general, equipment 156 may perform any desired cost function analysis such as by computing a cost function that balances timing with other chip resource considerations for identifying an optimal logic design. A design that optimizes the cost function may have optimal performance taking into account the timing and other design constraints, for example. If desired, equipment 156 may store any generated timing information or cost function information for later reference. This may allow equipment 156 to track and store information about the cost of performing individual physical synthesis transforms on the design, for example.

At step 260, equipment 156 may determine whether the cost of the logic design has improved by performing the selected physical synthesis transform (and the corresponding legalization). For example, equipment 156 may compare a cost function computed for the logic design after the physical synthesis transform has been performed to a cost function computed for the logic design before the transform was performed. If the cost function after the transform was performed is more optimized (more optimal) than before the transform was performed (e.g., if the cost has decreased or otherwise improved), processing may proceed to step 266 as shown by path 264. For example, if the timing of the design is faster (e.g., there is less signal propagation delay) after performing the selected physical synthesis transform than before, processing may proceed to step 266.

If the cost function after the transform has been performed is less optimized than before the transform was performed (e.g., if the cost has increased or otherwise not improved), equipment 156 may reject (undo) the selected physical synthesis transform and processing may proceed to step 263.

At step 263, equipment 156 may revert (restore) the netlist to its state prior to when the selected physical synthesis transform was performed (e.g., to an initial state of the netlist after performing step 253 and prior to performing step 254 for the selected transform). If desired, equipment 156 may reject the selected physical synthesis transform if the cost (timing) remains the same after performing the selected physical synthesis transform.

Processing may subsequently loop back to step 252 as shown by path 265 to select a different physical synthesis transform to perform on the critical region. For example, if the timing of the device has gotten worse (e.g., there is more signal propagation delay) after performing the selected physical synthesis transform than before, processing will restore the netlist to its state before the selected physical synthesis transform and may loop back to step 252 to try a different transform for improving the timing of the design.

At step 266, equipment 156 may determine whether other critical regions remain in the logic design. For example, equipment 156 may identify other regions or paths of BLEs, ALMs, and/or LABs having insufficient (unsatisfactory) timing performance or having improvable timing performance. If critical regions remain in the logic design, processing may loop back to step 250 as shown by path 268 to identify additional critical regions on which to perform physical synthesis transforms. If no critical regions remain, processing may be completed (e.g., processing may proceed to step 210, 214, 220, or 224 of FIG. 6).

By performing incremental physical synthesis, incremental timing analysis, and incremental legalization operations in this way, incremental adjustments can be made to the logic design in a legal and timing-optimized manner as the design is physically synthesized, without the need to re-synthesize the entire design (e.g., without the need to reject or accept an entire batch of changes) after the final netlist is generated. In other words, equipment 156 fully legalizes every physical synthesis transform in the logic design while ensuring that timing constraints are satisfied before another physical synthesis transform is performed. This results in a tangible improvement to the functioning of logic design computing equipment 156 itself (e.g., by increasing the speed and efficiency with which the final configuration data is generated), an improvement to the logic design system of FIG. 2 (e.g., by increasing the speed and efficiency with which integrated circuit devices 100 may be programmed with configuration data for performing desired logic functions), and an improvement to the technology of optimizing and implementing logic designs for integrated circuit devices, for example.

Figure 9:
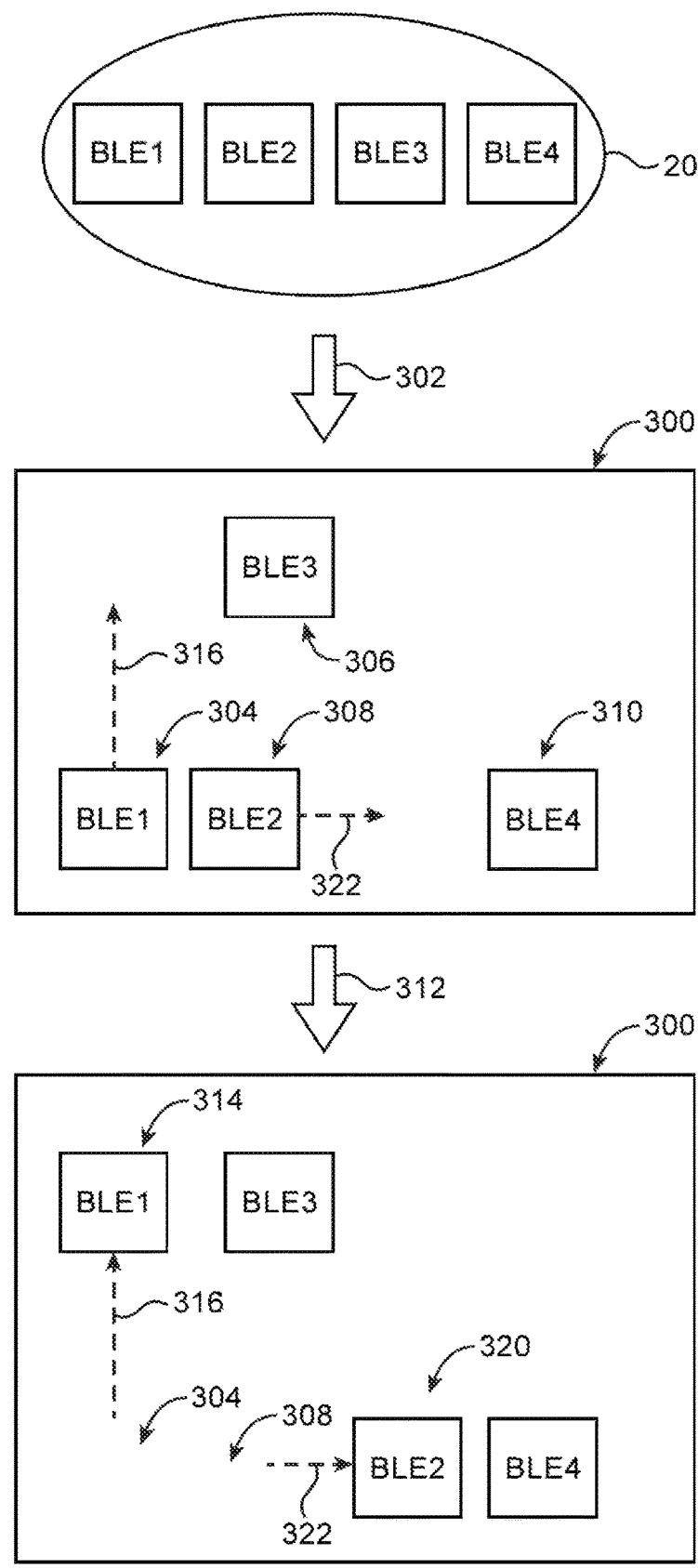
FIG. 9 is an illustrative diagram showing how basic logic elements may be physically placed within a logic design and subsequently transformed during a first incremental physical synthesis and timing analysis operation in accordance with an embodiment.
Figure 10:
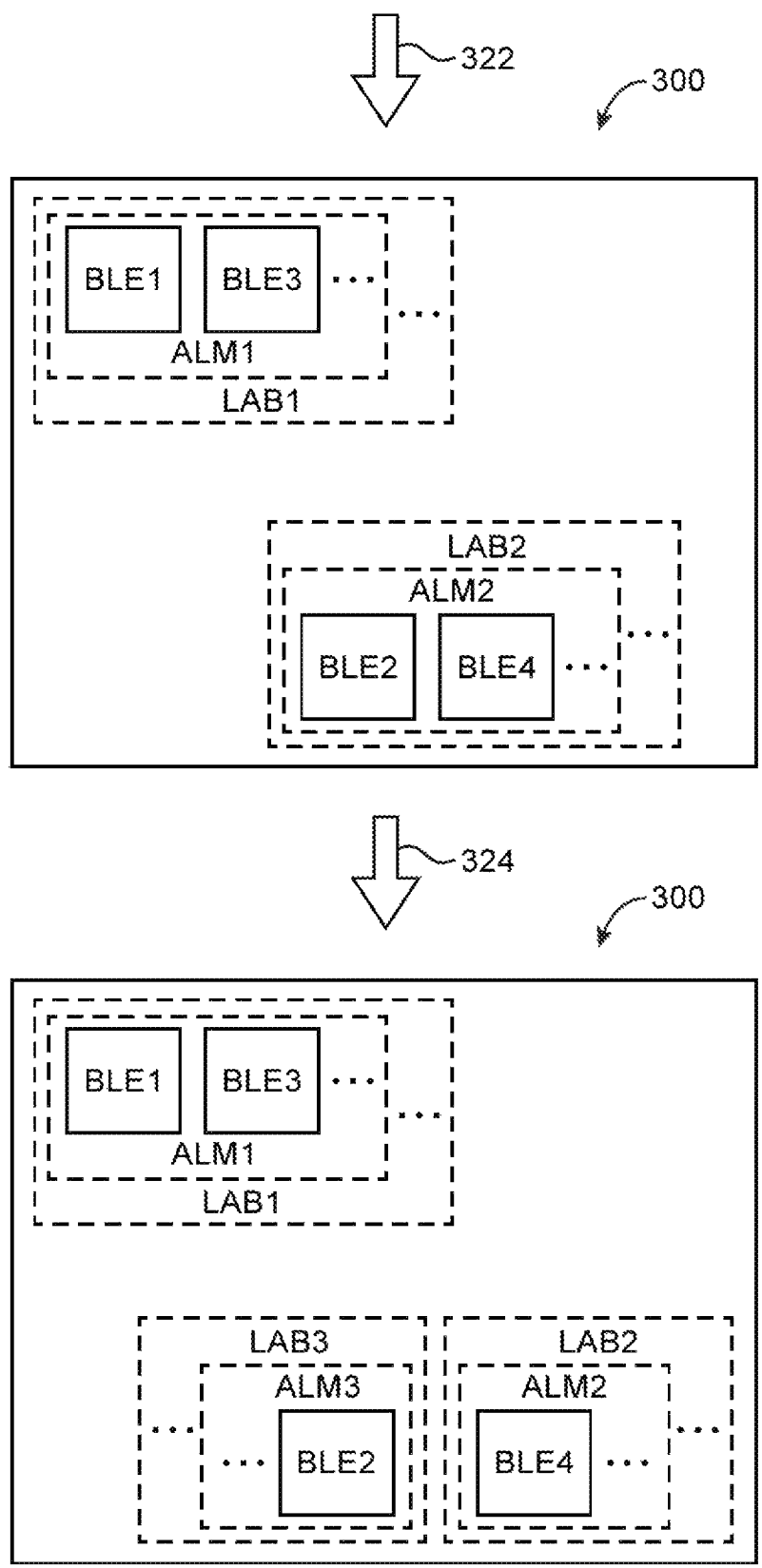
FIG. 10 is an illustrative diagram showing how basic logic elements may be clustered into adaptive logic modules and logic array blocks in a logic design, where the basic logic elements, adaptive logic modules, and/or logic array blocks may be subsequently transformed during a second incremental physical synthesis, timing analysis, and legalization operation in accordance with an embodiment.
Figure 11:
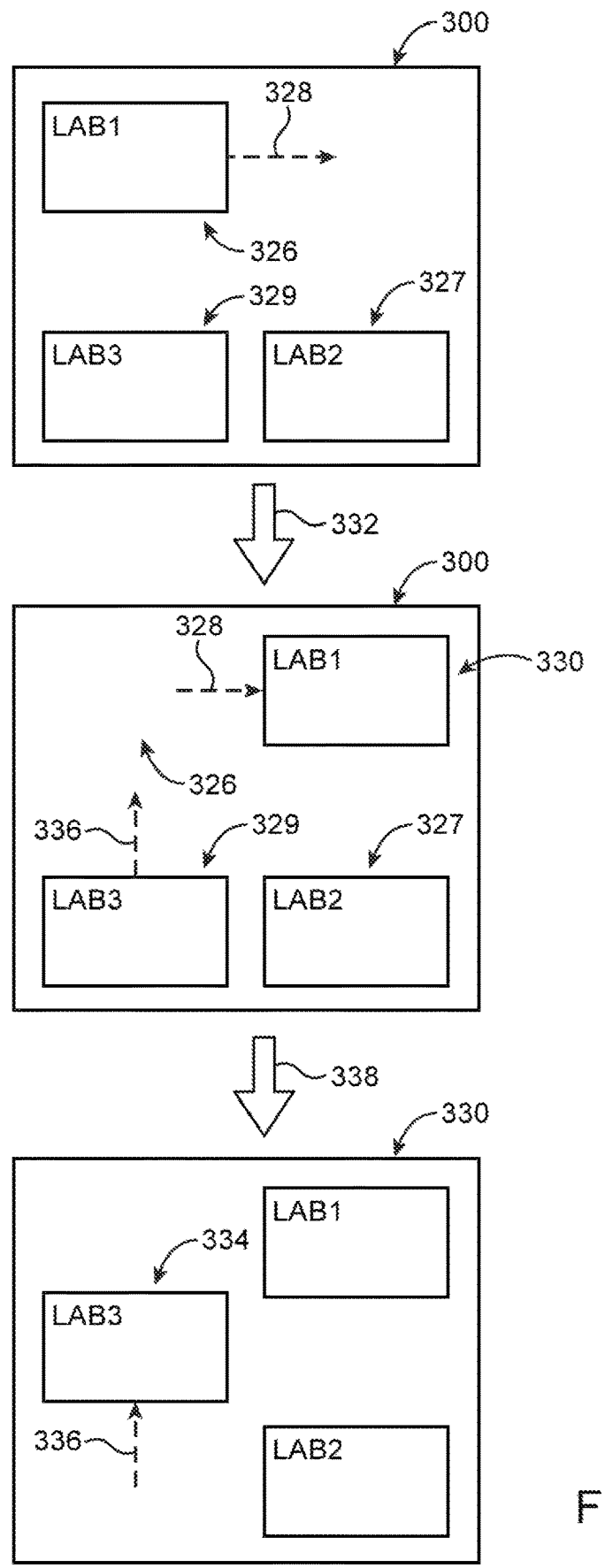
FIG. 11 is an illustrative diagram showing how logic array blocks in a logic design may be physically placed within a logic design, where the basic logic elements, adaptive logic modules, and/or logic array blocks may be subsequently transformed during a third incremental physical synthesis, timing analysis, and legalization operation in accordance with an embodiment.

FIGS. 9-11 are diagrams illustrating one example of how multiple rounds of incremental physical synthesis, timing analysis, and legalization operations may be performed on a logic design to satisfy timing and legality constraints for target device 100. The example shown in FIGS. 9-11 may be generated while processing the steps of FIGS. 6 and 8, for example.

FIG. 9 is a diagram showing how basic logic elements may be placed within the logic design and how a first incremental physical synthesis and timing analysis operation may be performed on the placed design. As shown in FIG. 9, design specification 203 may identify four BLEs BLE1, BLE2, BLE3, and BLE4. This example is merely illustrative and in general, any desired number of BLEs may be identified (e.g., dozens of BLEs, hundreds of BLEs, thousands of BLEs, millions of BLEs, etc.).

Equipment 156 may place the BLEs identified by specification 203 at physical locations within logic design 300 (e.g., within the layout of target device 100 and logically represented within a netlist) as shown by arrow 302 (e.g., while processing step 206 of FIG. 6). In the example of FIG. 9, BLE1 is placed at location 304, BLE2 is placed at location 308, BLE3 is placed at location 306, and BLE4 is placed at location 310. In general, the BLEs may be placed at any desired location in logic design 300.

Equipment 156 may perform first incremental physical synthesis and timing analysis operation 208 as shown by arrow 312. Performing first operation 208 may involve a number of physical synthesis transforms (e.g., as selected while processing step 252 of FIG. 8). In the example of FIG. 9, the selected physical synthesis transforms may be location adjustment operations performed on BLE1 and BLE2 (e.g., BLE1 and BLE2 may be within the critical region as identified at step 250 of FIG. 8). For example, operation 208 may involve a first location adjustment to move BLE1 from location 304 to location 314 as shown by arrow 316. Operation 208 may also involve a second location adjustment to move BLE2 from location 308 to location 320 as shown by arrow 322.

The location adjustments may improve the timing (cost) of design 300 (e.g., as identified at step 260 of FIG. 8). For example, design 300 may exhibit less signal propagation delay when BLE1 is located at location 314 than when BLE1 is located at location 304. Similarly, design 300 may exhibit less signal propagation delay when BLE2 is located at location 320 than location 308. Other location adjustments that do not improve the timing may have been attempted while performing operation 208 (e.g., while processing steps 254-260 of FIG. 8). However, each of these adjustments may be rejected until moves 316 and 322 that improve the timing (or otherwise satisfy the timing constraints) are found and incorporated into the netlist. This physical synthesis transform is merely illustrative and does not limit the number and types of transforms performed by physical synthesis. In general, netlist connectivity may be changed by modifying BLEs and moving registers across combinational logic, in addition to adjusting placement of BLEs.

FIG. 10 is a diagram showing how basic logic elements may be clustered within ALMs and LABs in the logic design and how an incremental physical synthesis, timing analysis, and legalization operation may be performed on the placed design. As shown in FIG. 10, equipment 156 may cluster (pack) the placed BLEs within corresponding ALMs and LABs within logic design 300 as shown by arrow 322 (e.g., while processing step 210 of FIG. 6).

In the example of FIG. 10, BLE1 and BLE3 are clustered within a corresponding adaptive logic module ALM1 and within a corresponding logic array block LAB'. Similarly, BLE2 and BLE4 are clustered within a corresponding ALM2 of a corresponding LAB2. If desired, the BLEs may be clustered into ALMs and LABs based on the relative locations of the BLEs within design 300. For example, BLEs that are adjacent to each other or within the same portion of design 300 may be clustered into the same ALMs and LABs. This example is merely illustrative. If desired, BLE1 and BLE3 may be clustered into different ALMs within LAB'. Additional BLEs may be clustered into ALM1 and additional ALMs may be clustered into LAB'. Additional LABs (not shown) may be formed within design 300.

Equipment 156 may perform incremental physical synthesis, timing analysis, and legalization operation 212 on logic design 300 as shown by arrow 324. Performing operation 212 may involve a number of physical synthesis transforms. In the example of FIG. 10, the physical synthesis transforms may be BLE re-clustering operations performed on BLE2 and BLE4 (e.g., LAB2 may be within the identified critical region of design 300). For example, equipment 156 may perform a physical synthesis transform that re-clusters BLE2 within a corresponding ALM3 of a corresponding LAB3 (e.g., BLE2 may be unpacked from ALM2 and LAB2).

The adjustments to LAB2 and LAB3 may improve the timing (cost) of design 300. For example, design 300 may exhibit less signal propagation delay when BLE2 is clustered within LAB3 than when BLE2 is clustered within LAB2. Legalization operations may be performed on design 300 if clustering BLE2 within LAB3 does not initially satisfy the legalization constraints. For example, re-clustering BLE2 may slightly adjust the location of LAB3 and/or LAB2 in design 300. If other logic blocks in design 300 conflict with the adjusted locations of LAB3 and LAB2, the other logic blocks may be legalized (e.g., moved to other legal locations in design 300). If legalization is not possible, a different physical synthesis transform may be attempted.

Other clustering or physical synthesis transforms that do not improve the timing may have been attempted while performing operation 212. However, each of these adjustments may be individually rejected (even if the adjustments are legal) until clustered LAB1 and LAB2 that improve the timing are found and incorporated into the netlist (e.g., following steps 252-260 of FIG. 8). This physical synthesis transform is merely illustrative and does not limit the number and types of transforms performed by physical synthesis. In general, netlist connectivity may be changed by modifying BLEs and moving registers across combinational logic, in addition to adjusting placement of BLEs and LABs. All such transforms ensure that the modified BLEs are legalized into ALMs and LABs (i.e., the design satisfies local ALM and LAB legality rules of the target device).

FIG. 11 is a diagram showing how the placement of LABs within design 300 may be adjusted within the logic design and how an additional incremental physical synthesis, timing analysis, and legalization operation may be performed on the placed design.

As shown in FIG. 11, equipment 156 may place the clustered LABs in design 300 at desired physical locations within logic design 300 as shown by arrow 332 (e.g., while processing step 214 of FIG. 6). In the example of FIG. 11, LAB1 is placed at location 326, LAB2 is placed at location 327, and LAB3 is placed at location 329. Performing operation 214 may move one or more of the LABs within logic design 300. In the example of FIG. 11, operation 214 moves LAB1 from location 326 to location 330 in design 300 as shown by arrow 328. Placing LAB1 at location 330 may improve the cost (timing) of design 300 relative to when LAB1 is placed at location 326 or may otherwise be required based on the desired implementation of design 300, for example. If the placed LABs within design 300 initially violate the legality rules, the LABs may be legalized (e.g., moved to legal locations while processing step 216 of FIG. 6). For example, if a BLE or other element is located at location 330, that BLE may be moved to a vacant location in design 300 to accommodate LAB1 at location 330.

Equipment 156 may perform incremental physical synthesis, timing analysis, and legalization operation 218 on logic design 300 as shown by arrow 338. Performing operation 218 may involve a number of physical synthesis transforms. In the example of FIG. 11, the physical synthesis transforms may be placement adjustment operations performed on LAB3 (e.g., LAB3 may be along a critical path of design 300). For example, equipment 156 may perform a physical synthesis transform that moves LAB3 from location 329 to location 334 as shown by arrow 336. The location adjustment to LAB3 may improve the timing (cost) of design 300. For example, design 300 may exhibit less signal propagation delay when LAB3 is located at location 334 than when LAB3 is located at location 329. If other logic blocks in design 300 conflict with the adjusted locations of LAB3, the other logic blocks may be legalized (e.g., moved to other legal locations in design 300). If legalization is not possible, other physical synthesis transforms may be attempted.

Other location adjustments to the LABs that do not improve the timing may have been attempted while performing operation 218. However, each of these adjustments may be individually rejected until move 336 that improves the timing is found and incorporated into the netlist. This physical synthesis transform is merely illustrative and does not limit the number and types of transforms performed by physical synthesis. In general, netlist connectivity may be changed by modifying BLEs and moving registers across combinational logic, in addition to adjusting placement of BLEs and LABs. All such transforms ensure that the modified BLEs are legalized into ALMs and LABs (i.e., the design satisfies local ALM and LAB legality rules as well as chip legality rules of the target device).

If desired, additional adjustments such as those performed at steps 220 and 222 of FIG. 6 may be performed on design 300 before the netlist is converted to configuration data for configuring target device 100. By performing multiple different incremental physical synthesis, timing analysis, and legalization operations in this way, incremental adjustments can be made to the logic design in a legal and timing-optimized manner as the design is physically synthesized, without the need to re-synthesize the entire design (e.g., without the need to reject or accept an entire batch of changes) after the final netlist is generated.

The example of FIGS. 9-11 in which placement adjustment and re-clustering physical synthesis transforms are performed is merely illustrative. If desired, any desired physical synthesis transforms may be performed. Any desired number of BLEs, ALMs, and LABs may be operated on by equipment 156. Adjustments to interconnections between the BLEs, ALMs, and LABs may be included in the physical synthesis transforms if desired. These operations may be repeated across the entire logic design if desired.

The foregoing is merely illustrative of the principles of this invention and various modifications can be made by those skilled in the art without departing from the scope and spirit of the invention. The foregoing embodiments may be implemented individually or in any combination.

What is claimed is:

1. A method of using logic design equipment to generate configuration data for loading onto a target device, wherein the target device implements a logic design when loaded with the configuration data, the method comprising:
   placing a set of basic logic elements (BLEs) at locations in the logic design;
   performing a first set of incremental physical synthesis transforms on the set of BLEs;
   performing a first set of timing analysis operations based on the first set of incremental physical synthesis transforms;
   after performing the first set of incremental physical synthesis transforms and after performing the first set of timing analysis operations, packing the BLEs into logic array blocks (LABs) in the logic design;
   performing a second set of incremental physical synthesis transforms on the LABs in the logic design, wherein performing the second set of incremental physical synthesis transforms comprises identifying respective subsets of physical synthesis transforms; and
   performing a second set of timing analysis operations, wherein performing the second set of timing analysis operations comprises performing a corresponding timing analysis operation for each of the respective subsets of physical synthesis transforms.

2. The method defined in claim 1, wherein performing the second set of incremental physical synthesis transforms comprises performing an operation selected from the group consisting of re-packing the LABs in the logic design and deleting at least one of the LABs in the logic design.

3. The method defined in claim 1, wherein the basic logic elements comprise a logic element selected from the group consisting of:
   a look-up table, a flip-flop, a block random access memory element, a digital signal processor, and a carry chain.

4. The method defined in claim 1, wherein performing the first set of incremental physical synthesis transforms and performing the second set of incremental physical synthesis transforms comprise altering a netlist.

5. The method defined in claim 4, further comprising:
   assembling the configuration data based on the altered netlist file; and
   transmitting the configuration data to a configuration device that configures the target device using the configuration data assembled by the assembler.

6. The method defined in claim 1, wherein the first set of incremental physical synthesis transforms comprises a physical synthesis transform selected from the group consisting of:
   a retiming operation, a slack equalization operation, a LAB packing operation, a LAB unpacking operation, a placement adjustment operation, a look-up table input rotation operation, a logic duplication operation, and a critical path re-synthesis (CPR) operation.

7. The method defined in claim 1, further comprising:
   after performing the second set of incremental physical synthesis transforms and after performing the second set of timing analysis operations, moving the LABs to modified locations within the logic design.

8. The method defined in claim 7, further comprising:
   after moving the LABs to the modified locations, performing a third set of incremental physical synthesis transforms and a third set of timing analysis operations on the logic design.

9. The method defined in claim 8, further comprising:
identifying legality constraints associated with the target device;
performing,
based on the identified legality constraints, a first legalization operation on the logic design after packing the BLEs into the LABs in the logic design and before moving the LABs to the modified locations within the logic design; and
performing, based on the identified legality constraints, a second legalization operation on the logic design after moving the LABs to the modified locations and before performing the third set of incremental physical synthesis transforms and the third set of timing analysis operations.

10. The method defined in claim 9, wherein performing the second legalization operation comprises:
determining whether any logic blocks in the logic design are located at a first of the modified locations prior to moving the LABs to the modified locations;
in response to determining that no logic blocks are located at the first modified location, placing a first of the LABs at the first modified location; and
in response to determining that a given logic block is located at the first modified location, moving the given logic block out of the first modified location and placing the first packed LAB at the first modified location after moving the given logic block out of the first modified location.

11. The method defined in claim 8, further comprising:
after performing the third set of incremental physical synthesis transforms and the third set of timing analysis operations, performing placement refinement operations on the LABs in the logic design;
after performing the placement refinement operations, performing a fourth set of incremental physical synthesis transforms and a fourth set of timing analysis operations on the logic design;
saving a netlist file that identifies the logic design after performing the fourth set of incremental physical synthesis transforms and the fourth set of timing analysis operations;
assembling the configuration data based on the saved netlist file; and
transmitting the configuration data to a configuration device that configures the target device using the configuration data assembled by the assembler.

12. A method of operating a system to implement a logic design on a programmable integrated circuit using configuration data, the method comprising:
with logic design equipment in the system, packing basic logic elements (BLEs) in the logic design within logic array blocks (LABs) in the logic design;
with the logic design equipment, performing a first set of incremental physical synthesis transforms on the packed BLEs based on a first set of timing analysis operations, wherein performing the first set of incremental physical synthesis transforms comprises:
updating the logic design from a prior state to an updated state by incorporating a first physical synthesis transform;
selectively reverting the logic design from the updated state to the prior state based on a corresponding timing analysis operation associated with the first physical synthesis transform; and
performing additional physical synthesis transforms and corresponding timing analysis operations after updating and selectively reverting the logic design;
with the logic design equipment, placing the LABs at selected locations within the logic design that satisfy legality constraints associated with the programmable integrated circuit; and
with the logic design equipment, after placing the LABs at the selected locations, performing a second set of incremental physical synthesis transforms on the logic design based on a second set of timing analysis operations.

13. The method defined in claim 12, wherein packing the BLEs within the LABs comprises packing the BLEs within adaptive logic modules (ALMs) in the LABs, the method further comprising:
with the logic design equipment, refining placement of the BLEs, ALMs, and LABs in the logic design after performing the second set of incremental physical synthesis transforms; and
with the logic design equipment, performing a third set of incremental physical synthesis transforms on the logic design based on a third set of timing analysis operations after refining the placement of the BLEs, ALMs, and LABs in the logic design.

14. The method defined in claim 12, further comprising:
with the logic design equipment in the system, generating a netlist that identifies the logic design based on a hardware description language (HDL) file, wherein packing the BLEs within the LABs, performing the first set of incremental physical synthesis transforms, placing the LABs at the selected locations, and performing the second set of incremental physical synthesis transforms modify the netlist;
with an assembler on the logic design equipment, assembling the configuration data based on the netlist after the netlist has been modified by performing the second set of incremental physical synthesis transforms;
with the logic design equipment, passing the configuration data to a configuration device in the system that is separate from the logic design equipment; and
with the configuration device, loading the configuration data onto the programmable integrated circuit to implement the logic design on the programmable implemented circuit.

15. A non-transitory computer-readable storage medium for generating configuration data for a target device, the target device configured to implement a logic design when loaded with the configuration data, the non-transitory computer-readable storage medium comprising instructions for:
placing a set of basic logic elements (BLEs) at locations in the logic design;
performing a first set of incremental physical synthesis transforms and a first set of timing analysis operations on the placed set of BLEs;
after performing the first set of incremental physical synthesis transforms and the first set of timing analysis operations, packing the BLEs into logic array blocks (LABs) in the logic design; and
performing a second set of incremental physical synthesis transforms and a second set of timing analysis operations on the LABs in the logic design, wherein the instructions for performing the second set of incremental physical synthesis transforms and the second set of timing analysis operations comprises instructions for:
performing respective subsets of physical synthesis transforms; and performing a corresponding timing analysis operation after performing each of the respective subsets of physical synthesis transforms.

16. The non-transitory computer-readable storage medium defined in claim 15, wherein the instructions for performing each of the respective subsets of physical synthesis transforms comprise instructions for performing an operation selected from the group consisting of re-packing the LABs in the logic design and deleting at least one of the LABs in the logic design.

17. The non-transitory computer-readable storage medium defined in claim 15, wherein the basic logic elements comprise a logic element selected from the group consisting of:
 a look-up table, a flip-flop, a block random access memory element, a digital signal processor, and a carry chain.

18. The non-transitory computer readable storage medium defined in claim 15, wherein the instructions for performing the first set of incremental physical synthesis transforms and the first set of timing analysis operations and performing the second set of incremental physical synthesis transforms and the second set of timing analysis operations comprise instructions for altering a netlist.

19. The non-transitory computer readable storage medium defined in claim 15, wherein the first set of incremental physical synthesis transforms comprises a physical synthesis transform selected from the group consisting of:
 a retiming operation, a slack equalization operation, a LAB packing operation, a LAB unpacking operation, a placement adjustment operation, a look-up table input rotation operation, a logic duplication operation, and a critical path re-synthesis (CPR) operation.

20. The non-transitory computer readable storage medium defined in claim 15, wherein a given subset in the respective subsets of physical synthesis transforms comprises a given physical synthesis transform, and wherein the instructions for performing the second set of incremental physical synthesis transforms and the second set of timing analysis operations further comprises instructions for:
 selectively rejecting the given physical synthesis transform based on the corresponding timing analysis operation performed after the given physical synthesis transform.

* * * * *